(12) United States Patent
Fornell et al.

(10) Patent No.: US 8,666,515 B2
(45) Date of Patent: Mar. 4, 2014

(54) STATISTICAL IMPACT ANALYSIS MACHINE

(75) Inventors: Claes Fornell, Dexter, MI (US);
Jaesung Cha, Duluth, GA (US); Philip Debard Doriot, Powder Springs, GA (US)

(73) Assignee: CFI Group USA, LLC, Ann Arbor, MI (US)

(*) Notice: Subject to any disclaimer, the term of this patent is extended or adjusted under 35 U.S.C. 154(b) by 0 days.

(21) Appl. No.: 13/143,422

(22) PCT Filed: Jan. 7, 2009

(86) PCT No.: PCT/US2009/030315
§ 371 (c)(1),
(2), (4) Date: Feb. 22, 2012

(87) PCT Pub. No.: WO2010/080146
PCT Pub. Date: Jul. 15, 2010

(65) Prior Publication Data
US 2013/0110271 A1 May 2, 2013

(51) Int. Cl.
G05B 13/02 (2006.01)

(52) U.S. Cl.
USPC .......... 700/28; 700/29; 700/31; 700/34; 700/52; 700/54

(58) Field of Classification Search
USPC .............. 700/28, 29, 31, 34, 52, 54
See application file for complete search history.

(56) References Cited

U.S. PATENT DOCUMENTS

| | | | |
|---|---|---|---|
| 6,192,319 B1* | 2/2001 | Simonson et al. | 702/81 |
| 2002/0169658 A1* | 11/2002 | Adler | 705/10 |
| 2002/0177909 A1* | 11/2002 | Fu et al. | 700/28 |
| 2008/0082195 A1* | 4/2008 | Samardzija | 700/109 |
| 2008/0215386 A1* | 9/2008 | Eder | 705/7 |

* cited by examiner

*Primary Examiner* — Ronald Hartman, Jr.
(74) *Attorney, Agent, or Firm* — Harness, Dickey & Pierce, PLC

(57) ABSTRACT

A computer-implemented initial run module processes manifest variable data using computer-defined model specification parameters stored in a database to provide initial estimates of weights that are associated with latent variables. The initial run module employs a unique value-based weighting partial least squares computer-implemented process. A final run module then operates upon the manifest variable data to determine the importance of the predictor values that are then used to control the industrial, manufacturing or commercial process. The final run module implements a unique patient partial least squares regression model utilizing a boosting learning technique.

25 Claims, 20 Drawing Sheets

Measurement Model
Specification Matrix (MM)

|       | LV01 | LV02 | LV03 | ... | LV21 | LV22 | ... | LV_k |
|-------|------|------|------|-----|------|------|-----|------|
| MV001 | 1    | 0    | 0    | ... | 0    | 0    | ... | ...  |
| MV002 | 1    | 0    | 0    | ... | 0    | 0    | ... | ...  |
| MV003 | 1    | 0    | 0    | ... | 0    | 0    | ... | ...  |
| MV004 | 0    | 1    | 0    | ... | 0    | 0    | ... | ...  |
| MV005 | 0    | 1    | 0    | ... | 0    | 0    | ... | ...  |
| MV006 | 0    | 1    | 1    | ... | 0    | 0    | ... | ...  |
| MV007 | 0    | 0    | 1    | ... | 0    | 0    | ... | ...  |
| :     | :    | :    | :    | :   | :    | :    | :   |      |
| :     | :    | :    | :    | :   | :    | :    | :   |      |
| MV103 | 0    | 0    | 0    | ... | 1    | 0    | ... | ...  |
| MV104 | 0    | 0    | 0    | ... | 1    | 0    | ... | ...  |
| MV105 | 0    | 0    | 0    | ... | 1    | 0    | ... | ...  |
| MV106 | 0    | 0    | 1    | ... | 1    | 1    | ... | ...  |
| MV107 | 0    | 0    | 1    | ... | 1    | 1    | ... | ...  |
| MV108 | 0    | 0    | 0    | ... | 0    | 1    | ... | ...  |
| MV109 | 0    | 0    | 0    | ... | 0    | 1    | ... | ...  |
| MV110 | 0    | 0    | 0    | ... | 0    | 1    | ... | ...  |
| MV111 | 0    | 0    | 0    | ... | 0    | 1    | ... | ...  |
| :     | :    | :    | :    | :   | :    | :    | :   | ...  |
| MV_m  | :    | :    | :    | :   | :    | :    | :   | ...  |

Figure 3

Path Structure Matrix (PM)

|       | LV01 | LV02 | LV03 | ... | LV21 | LV22 | ... | LV_k |
|-------|------|------|------|-----|------|------|-----|------|
| LV01  | 9    | 9    | 9    | ... | 9    | 9    | ... | 9    |
| LV02  | 0    | 9    | 9    | ... | 9    | 9    | ... | 9    |
| LV03  | 1    | -1   | 9    | ... | 9    | 9    | ... | 9    |
| ...   | ...  | ...  | ...  | ... | ...  | ...  | ... | ...  |
| LV21  | 9    | 9    | 1    | ... | 9    | 9    | ... | 9    |
| LV22  | 9    | 0    | 0    | ... | 0    | 9    | ... | 9    |
| ...   | ...  | ...  | ...  | ... | ...  | ...  | ... | ...  |
| LV_k  | 9    | 9    | 9    | ... | 9    | 9    | ... | 9    |

Figure 4

Value-Based Weighting
Matrix V

|      | LV01 | LV02 | LV03 | ... | LV21 | LV22 | ... | LV_k |
|------|------|------|------|-----|------|------|-----|------|
| LV01 | 0    | 0    | 0    | ... | 0    | 0    | ... | 0    |
| LV02 | 1    | 0    | 0    | ... | 0    | 0    | ... | 0    |
| LV03 | 2    | 0    | 0    | ... | 0    | 0    | ... | 0    |
| ...  | ...  | ...  | ...  | ... | ...  | ...  | ... | ...  |
| LV21 | 0    | 0    | 1    | ... | 0    | 0    | ... | 0    |
| LV22 | 0    | 1    | 1    | ... | 1    | 0    | ... | 0    |
| ...  | ...  | ...  | ...  | ... | ...  | ...  | ... | ...  |
| LV_k | 0    | 0    | 0    | ... | 0    | 0    | ... | 0    |

Figure 5

MinMax of Manifest
Variable Matrix

|       | Min | Max |
|-------|-----|-----|
| MV001 | 1   | 10  |
| MV002 | 0   | 10  |
| MV003 | 1   | 7   |
| MV004 | 0   | 5   |
| MV005 | 1   | 10  |
| MV006 | 1   | 10  |
| MV007 | 1   | 10  |
| ⋮     |     |     |
| MV103 | 1   | 10  |
| MV104 | 1   | 10  |
| MV105 | 1   | 10  |
| MV106 | 1   | 7   |
| MV107 | 1   | 7   |
| MV108 | 1   | 7   |
| MV109 | 0   | 1   |
| MV110 | 1   | 2   |
| MV111 | 1   | 5   |
| ⋮     |     |     |
| MV_m  | 1   | 10  |

Figure 6

MV Database

| MV Names | CallsAnswerd | AnswerRate | TimeOnHold | AvgWaitTime | AvgHandleTime | q_1 | q_2 | q_3 | q_4 | q_5 | q_6 | q_7 | q_8 | q_9 | q_10 |
|---|---|---|---|---|---|---|---|---|---|---|---|---|---|---|---|
| MV Data | 1903 | 7.31 | 2.7 | 3.1 | 2.3 | 8 | 8 | 9 | 5 | 5 | 3 | 9 | 8 | 347.52 | 47.75 |
| | 2755 | 6.2 | 2.6 | 3.0 | 2.2 | 10 | 10 | 9 | 9 | 9 | 8 | 9 | 10 | 543.00 | 67.30 |
| | 2563 | 6.97 | 2.1 | 2.0 | 2.2 | 5 | 5 | 7 | 5 | 2 | 6 | 1 | 1 | 135.75 | 1.58 |
| | 1964 | 4.43 | 2.3 | 2.6 | 1.9 | 10 | 10 | 10 | 10 | 10 | 10 | 10 | 10 | 543.00 | 67.30 |
| | 1490 | 0.33 | 2.1 | 2.5 | 2.3 | 4 | 10 | 10 | 10 | 10 | 10 | 8 | 1 | 217.20 | 34.72 |
| | 1100 | 0.27 | 2.6 | 3.0 | 2.2 | 9 | 9 | 9 | 10 | 10 | 9 | 10 | 10 | 439.83 | 56.98 |
| | 852 | 0.12 | 2.1 | 2.4 | 2.2 | 5 | 7 | 7 | 7 | 7 | 6 | 10 | 5 | 190.05 | 32.01 |
| | 1402 | 1.82 | 2.5 | 2.9 | 2.2 | 7 | 10 | 8 | 8 | 8 | 5 | 6 | 8 | 266.07 | 39.61 |
| | 2343 | 5.1 | 2.5 | 2.9 | 2.1 | 8 | 8 | 8 | 7 | 7 | 5 | 8 | 8 | 347.52 | 47.75 |
| | 1859 | 8.87 | 2.3 | 2.7 | 1.9 | 8 | 8 | 8 | 8 | 10 | 8 | 8 | 8 | 347.52 | 47.75 |
| | 2625 | 3.31 | 2.0 | 1.8 | 2.1 | 1 | 1 | 1 | -90 | -90 | -90 | -90 | -90 | 75.43 | 11.46 |
| | 2688 | 17.7 | 1.9 | 2.3 | 2.1 | 5 | 5 | 6 | 7 | 7 | 7 | 9 | 7 | 162.90 | 4.29 |
| | 1941 | 1.04 | 2.4 | 2.8 | 2.0 | 10 | 10 | 10 | 10 | 10 | 10 | 7 | 10 | 543.00 | 67.30 |
| | 1605 | 4.34 | 2.6 | 3.0 | 2.3 | 6 | 6 | 6 | 5 | 8 | 3 | 5 | 4 | 195.48 | 7.55 |

Figure 14

| MV Names | Min | Max |
|---|---|---|
| CallsAnswerd | 0 | 100 |
| AnswerRate | 0 | 100 |
| TimeOnHold | 0 | 100 |
| AvgWaitTime | 0 | 100 |
| AvgHandleTime | 0 | 100 |
| q_1 | 1 | 10 |
| q_2 | 1 | 10 |
| q_3 | 1 | 10 |
| q_4 | 1 | 10 |
| q_5 | 1 | 10 |
| q_6 | 1 | 10 |
| q_7 | 1 | 10 |
| q_8 | 1 | 10 |
| q_9 | 0 | 100 |
| q_10 | 0 | 100 |

Figure 15

| MV Names | LV Names | | | | | | | |
|---|---|---|---|---|---|---|---|---|
| | ServiceLevel | TimeOnHold | AvgHandleTime | ServiceRep | SpeedOfProbSolving | Effectiveness | Satisfaction | LTV Revenue |
| CallsAnswerd | 1 | 0 | 0 | 0 | 0 | 0 | 0 | 0 0 |
| AnswerRate | 1 | 0 | 0 | 0 | 0 | 0 | 0 | 0 0 |
| TimeOnHold | 0 | 1 | 0 | 0 | 0 | 0 | 0 | 0 0 |
| AvgWaitTime | 0 | 1 | 0 | 0 | 0 | 0 | 0 | 0 0 |
| AvgHandleTime | 0 | 0 | 1 | 0 | 0 | 0 | 0 | 0 0 |
| q_1 | 0 | 0 | 0 | 1 | 0 | 0 | 0 | 0 0 |
| q_2 | 0 | 0 | 0 | 1 | 0 | 0 | 0 | 0 0 |
| q_3 | 0 | 0 | 0 | 0 | 1 | 0 | 0 | 0 0 |
| q_4 | 0 | 0 | 0 | 0 | 1 | 0 | 0 | 0 0 |
| q_5 | 0 | 0 | 0 | 0 | 0 | 1 | 0 | 0 0 |
| q_6 | 0 | 0 | 0 | 0 | 0 | 0 | 1 | 0 0 |
| q_7 | 0 | 0 | 0 | 0 | 0 | 0 | 1 | 0 0 |
| q_8 | 0 | 0 | 0 | 0 | 0 | 0 | 1 | 0 0 |
| q_9 | 0 | 0 | 0 | 0 | 0 | 0 | 0 | 1 0 |
| q_10 | 0 | 0 | 0 | 0 | 0 | 0 | 0 | 0 1 |

| LV Names | ServiceLevel | TimeOnHold | AvgHandleTime | ServiceRep | SpeedOfProbSolving | Effectiveness | Satisfaction | LTV | Revenue |
|---|---|---|---|---|---|---|---|---|---|
| ServiceLevel | -9 | -9 | -9 | -9 | -9 | -9 | -9 | -9 | -9 |
| TimeOnHold | -9 | -9 | -9 | -9 | -9 | -9 | -9 | -9 | -9 |
| AvgHandleTime | -9 | -9 | -9 | -9 | -9 | -9 | -9 | -9 | -9 |
| ServiceRep | 1 | -1 | 0 | -9 | -9 | -9 | -9 | -9 | -9 |
| SpeedOfProbSolving | -9 | -1 | 0 | -9 | -9 | -9 | -9 | -9 | -9 |
| Effectiveness | -9 | -9 | -9 | -9 | -9 | -9 | 1 | -9 | -9 |
| Satisfaction | -9 | -9 | -9 | 1 | 1 | 1 | -9 | 0 | -9 |
| LTV | -9 | -9 | -9 | -9 | -9 | -9 | -9 | -9 | -9 |
| Revenue | -9 | -9 | -9 | -9 | -9 | -9 | 0 | 0 | -9 |

Figure 18

| LV Names | ServiceLevel | TimeOnHold | AvgHandleTime | ServiceRep | SpeedOfProbSolving | Effectiveness | Satisfaction | LTV | Revenue |
|---|---|---|---|---|---|---|---|---|---|
| ServiceLevel | 0 | 0 | 0 | 0 | 0 | 0 | 0 | 0 | 0 |
| TimeOnHold | 0 | 0 | 0 | 0 | 0 | 0 | 0 | 0 | 0 |
| AvgHandleTime | 0 | 0 | 0 | 0 | 0 | 0 | 0 | 0 | 0 |
| ServiceRep | 1 | 1 | 1 | 0 | 0 | 0 | 0 | 0 | 0 |
| SpeedOfProbSolving | 0 | 2 | 0 | 0 | 0 | 0 | 0 | 0 | 0 |
| Effectiveness | 0 | 0 | 0 | 0 | 1 | 0 | 1 | 0 | 0 |
| Satisfaction | 0 | 0 | 0 | 1 | 0 | 1 | 0 | 2 | 0 |
| LTV | 0 | 0 | 0 | 0 | 0 | 0 | 0 | 0 | 0 |
| Revenue | 0 | 0 | 0 | 0 | 0 | 0 | 2 | 1 | 0 |

Figure 19

| LV Names | ServiceLevel | TimeOnHold | AvgHandleTime | ServiceRep | SpeedOfProbSolving | Effectiveness | Satisfaction | LTV | Revenue |
|---|---|---|---|---|---|---|---|---|---|
| c | 0 | 1 | 0 | 0 | 0 | 0 | 0 | 0 | 0 |

| MV Names | LV Names | | | | | | | | |
|---|---|---|---|---|---|---|---|---|---|
| | ServiceLevel | TimeOnHold | AvgHandleTime | ServiceRep | SpeedOfProbSolving | Effectiveness | Satisfaction | LTV | Revenue |
| CallsAnswerd | 0.0000 | 0.0000 | 0.0000 | 0.0000 | 0.0000 | 0.0000 | 0.0000 | 0.0000 | 0.0000 |
| AnswerRate | 1.0000 | 0.0000 | 0.0000 | 0.0000 | 0.0000 | 0.0000 | 0.0000 | 0.0000 | 0.0000 |
| TimeOnHold | 0.0000 | 0.2760 | 0.0000 | 0.0000 | 0.0000 | 0.0000 | 0.0000 | 0.0000 | 0.0000 |
| AvgWaitTime | 0.0000 | 0.6524 | 0.0000 | 0.0000 | 0.0000 | 0.0000 | 0.0000 | 0.0000 | 0.0000 |
| AvgHandleTime | 0.0000 | 0.0000 | 1.0000 | 0.0000 | 0.0000 | 0.0000 | 0.0000 | 0.0000 | 0.0000 |
| q_1 | 0.0000 | 0.0000 | 0.0000 | 0.6402 | 0.0000 | 0.0000 | 0.0000 | 0.0000 | 0.0000 |
| q_2 | 0.0000 | 0.0000 | 0.0000 | 0.9219 | 0.0000 | 0.0000 | 0.0000 | 0.0000 | 0.0000 |
| q_3 | 0.0000 | 0.0000 | 0.0000 | 0.0000 | 1.0304 | 0.0000 | 0.0000 | 0.0000 | 0.0000 |
| q_4 | 0.0000 | 0.0000 | 0.0000 | 0.0000 | 0.6097 | 0.0000 | 0.0000 | 0.0000 | 0.0000 |
| q_5 | 0.0000 | 0.0000 | 0.0000 | 0.0000 | 0.0000 | 1.0000 | 0.0000 | 0.0000 | 0.0000 |
| q_6 | 0.0000 | 0.0000 | 0.0000 | 0.0000 | 0.0000 | 0.0000 | 0.4885 | 0.0000 | 0.0000 |
| q_7 | 0.0000 | 0.0000 | 0.0000 | 0.0000 | 0.0000 | 0.0000 | 0.6419 | 0.0000 | 0.0000 |
| q_8 | 0.0000 | 0.0000 | 0.0000 | 0.0000 | 0.0000 | 0.0000 | 0.5911 | 0.0000 | 0.0000 |
| q_9 | 0.0000 | 0.0000 | 0.0000 | 0.0000 | 0.0000 | 0.0000 | 0.0000 | 1.0000 | 0.0000 |
| q_10 | 0.0000 | 0.0000 | 0.0000 | 0.0000 | 0.0000 | 0.0000 | 0.0000 | 0.0000 | 1.0000 |

Figure 20

| MV Names | ServiceLevel | TimeOnHold | AvgHandleTime | ServiceRep | SpeedOfProbSolving | Effectiveness | Satisfaction | LTV | Revenue |
|---|---|---|---|---|---|---|---|---|---|
| CallsAnswerd | 0 | 0 | 0 | 0 | 0 | 0 | 0 | 0 | 0 |
| AnswerRate | 1 | 0 | 0 | 0 | 0 | 0 | 0 | 0 | 0 |
| TimeOnHold | 0 | 1 | 0 | 0 | 0 | 0 | 0 | 0 | 0 |
| AvgWaitTime | 0 | 1 | 0 | 0 | 0 | 0 | 0 | 0 | 0 |
| AvgHandleTime | 0 | 0 | 1 | 0 | 0 | 0 | 0 | 0 | 0 |
| q_1 | 0 | 0 | 0 | 0 | 0 | 0 | 0 | 0 | 0 |
| q_2 | 0 | 0 | 0 | 1 | 0 | 0 | 0 | 0 | 0 |
| q_3 | 0 | 0 | 0 | 1 | 0 | 0 | 0 | 0 | 0 |
| q_4 | 0 | 0 | 0 | 0 | 1 | 0 | 0 | 0 | 0 |
| q_5 | 0 | 0 | 0 | 0 | 1 | 0 | 0 | 0 | 0 |
| q_6 | 0 | 0 | 0 | 0 | 0 | 1 | 1 | 0 | 0 |
| q_7 | 0 | 0 | 0 | 0 | 0 | 0 | 1 | 0 | 0 |
| q_8 | 0 | 0 | 0 | 0 | 0 | 0 | 1 | 0 | 0 |
| q_9 | 0 | 0 | 0 | 0 | 0 | 0 | 0 | 1 | 0 |
| q_10 | 0 | 0 | 0 | 0 | 0 | 0 | 0 | 0 | 1 |

| LV Names | ServiceLevel | TimeOnHold | AvgHandleTime | ServiceRep | SpeedOfProbSolving | Effectiveness | Satisfaction | LTV | Revenue |
|---|---|---|---|---|---|---|---|---|---|
| ServiceLevel | | | | | | | | | |
| TimeOnHold | | | | | | | | | |
| AvgHandleTime | | | | | | | | | |
| ServiceRep | 0.3 | -0.4 | 1.5 | | | | | | |
| SpeedOfProbSolving | | 0 | 1.2 | | | | | | |
| Effectiveness | | | | | | | | | |
| Satisfaction | | | | 0.3 | 0.7 | 1.2 | | | |
| LTV | | | | | | | | 23.1 | |
| Revenue | | | | | | | | 4.3 | |

Figure 24

STATISTICAL IMPACT ANALYSIS MACHINE

CROSS-REFERENCE TO RELATED APPLICATION

This application is a 371 U.S. National Stage of International Application No. PCT/US2009/030315, filed Jan. 7, 2009, the content of which is incorporated herein by reference in its entirety.

FIELD

The present disclosure relates to a computer-implemented machine, apparatus and method for controlling manufacturing, industrial and commercial processes based on manipulation of measured data of physical properties. The machine, apparatus and method use computer-implemented statistical analytic processes to determine how to manipulate the measured data to achieve optimal performance of the controlled manufacturing, industrial and/or commercial processes.

BACKGROUND

This section provides background information related to the present disclosure which is not necessarily prior art.

The desire to improve quality has spread to nearly all manufacturing and service industries and businesses. There is a great interest in improving quality of products and services through systematic performance evaluation followed by business process improvement. Some industries are fortunate to have easily quantifiable metrics to measure the quality of their products or services. Using these metrics, a continuous improvement process can be implemented, whereby the product or service is produced using existing processes and assessed through quantifiable metrics, the existing processes are then changed based on the results of the metrics, and the efficacy of the change is tested by producing the product or service again using the changed process.

For most industries, however, finding a good, quantifiable metric has proven difficult, as business process have become quite complex and difficult to describe in quantifiable measures. Human intuition and judgment play an important role in production of goods and services, and ultimately, human satisfaction plays the decisive role in determining which goods and services sell well and which do not.

Human intuition and judgment and customer satisfaction are intangible variables that are not directly measurable and must therefore be inferred from data that are measurable. Therein lies the root of a major problem in applying continuous improvement techniques to achieve better quality. The data needed to improve quality are hidden, often deeply within reams of data that an organization generates for other purposes. Even surveys expressly designed to uncover this hidden data can frequently fail to produce meaningful results unless the data are well understood and closely monitored.

Experts in statistical analysis know to represent such intangible variables as latent variables that are derived from measurable variables known as manifest variables. Even experts in statistical analysis, however, cannot say that manifest variable A will always measure latent variable B. The relationship is rarely that direct. More frequently, the relationship between manifest variable A and latent variable B involves a hypothesis, which must be carefully tested through significant statistical analysis before being relied upon.

U.S. Pat. No. 6,192,319 discloses a statistical impact analysis system that uses a Partial Least Squares (PLS) software module to determine the relationships between manifest variables and latent variables. Traditional PLS algorithms, such as Latent Variable PLS (LV-PLS), are used to estimate the case values of the latent variables as the linear combinations of their manifest variables. In the existing LV-PLS algorithm, the PLS weights are determined in such a way that the specified predictive relationships explain the data. This data driven approach is appropriate when the research objective is to find the model structure best fitting a given data set. Current LV-PLS modules, however, do not allow a user to specify the strategic priorities of the performance measures so that the calculations of the predictor latent variables are tuned to better predict the performance measures with higher priorities. Thus, when assessing a product, service or business, it would be advantageous to be able to fine tune an impact analysis machine to predict the performance measures with higher priorities.

Furthermore, traditional PLS regression methods based upon NIPALS have two critical limitations. First, when predictor variables, that is, latent variables used to predict values of dependent latent variables, are highly correlated, the first component explains most of the variation in the response variable, and only a small portion is left to be explained by the subsequent components. Therefore, traditional PLS models result in only one or two components being used for prediction. The second limitation is that the current models do not have an effective way of constraining the coefficients used in the regression.

SUMMARY

This section provides a general summary of the disclosure, and is not a comprehensive disclosure of its full scope or all of its features.

A computer-implemented apparatus for controlling a process based on measured physical attributes. The apparatus has a computer memory having data structures for storing: (a) manifest variables based on the measured physical attributes; (b) latent variables representing causally related attributes associated with said manifest variables, the latent variables including predictor latent variables and dependent latent variables, wherein the dependent latent variables may be expressed as a linear combination of at least one predictor latent variables; and (c) model specification parameters including a path structure parameter indicating causal path attributes to express the causal relationship between the predictor latent variables and the dependent latent variables and a value-based parameter indicating prediction priorities that express relative importance of weights of the dependent latent variables with respect to the predictor latent variables.

The apparatus is further comprised of a computer-readable medium having encoded therein an initial run module that operates upon said data structures to provide estimates of weights associated with said latent variables. The initial run module provides estimates of weights of the manifest variables with respect to latent variables by employing a computer-implemented value-based weighting partial least squares process employing an inside approximation weighting scheme utilizing the value based parameter thereby allowing optimization of each latent variable according to its own prediction priorities.

The computer-readable medium also has encoded therein a final run module using the estimated weights and the manifest variables to calculate latent variable scores, wherein the latent variable scores are defined as weighted averages of manifest variables. The final run module employs a computer implemented patient partial least squares regression process that operates to calculate the path coefficients between predictor latent variables and dependent latent variables using the latent variable scores and path structure parameter. The final run module further provides control parameter for controlling the process, where the control parameters are selected using the path coefficients associated with said latent variables.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is an exemplary measurement model specification matrix MM;

FIG. 4 is an exemplary path structure matrix PM;

FIG. 5 is an exemplary value-based weighting matrix V;

FIG. 6 is an exemplary minimum and maximum of manifest variable matrix;

FIG. 14 is a depiction of an entry in manifest variable database in a specific example of the machine in use;

FIG. 15 is a depiction of the MinMax matrix in a specific example of the machine in use;

FIG. 16 is a depiction of the measurement model specification matrix in a specific example of the machine in use;

FIG. 17 is a depiction of the path structure matrix in a specific example of the machine in use;

FIG. 18 is a depiction of value-based weighting matrix in a specific example of the machine in use;

FIG. 19 is a depiction of the latent variable vector in a specific example of the machine in use;

FIG. 20 is a depiction of the output of the initial run module in a specific example of the machine in use;

FIG. 21 is a depiction of a respecified measurement model specification matrix after the initial run in a specific example of the machine in use;

Figure 22:
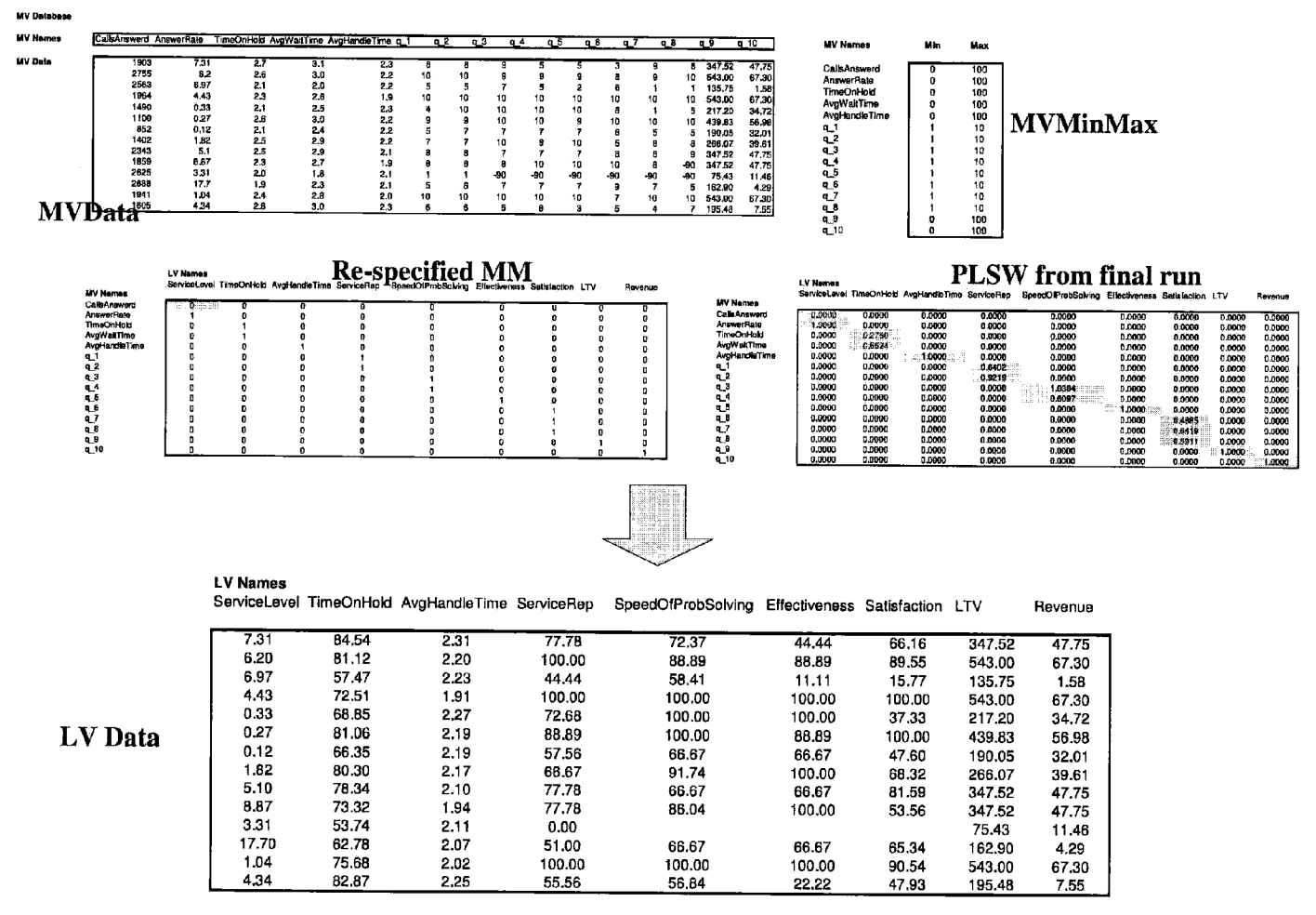
Figure 23:
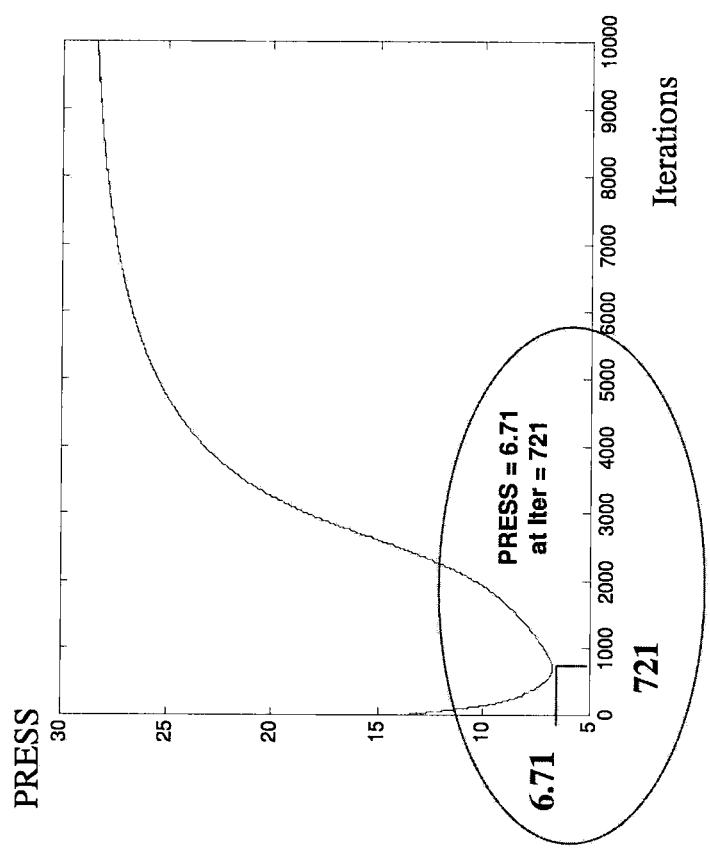

FIG. 22 displays the relationship between manifest variable data, model specification parameters, estimated weights and latent variable scores;

FIG. 23 displays a graph showing PRESS values over the course of 10000 iterations of the machine; and FIG. 24 displays the output of the final run module, namely a path coefficient matrix.

Corresponding reference numerals indicate corresponding parts throughout the several views of the drawings.

DETAILED DESCRIPTION

Example embodiments will now be described more fully with reference to the accompanying drawings.

Figure 1:
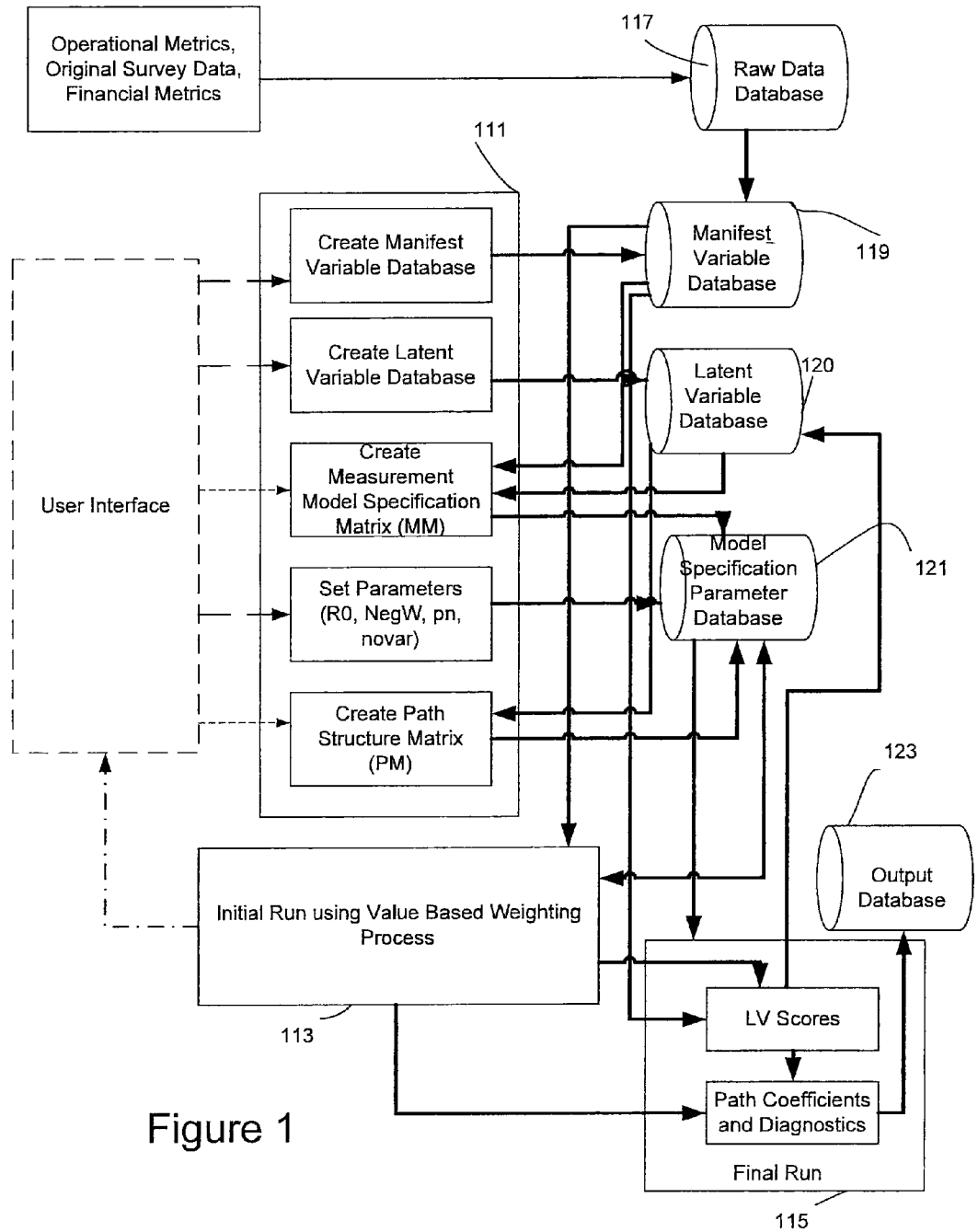
FIG. 1 is an exemplary system level architecture of the impact analysis machine.

Referring to FIG. 1, the impact analysis machine is comprised of three primary components, the initialization module 111, the initial run module 113 and the final run module 115. These three primary components, together with the associated databases with which they operate, may be implemented using suitably programmed computers or computer systems. The entire machine can be implemented on a single computer, or on multiple computers using client-server, parallel computing and/or hub and spoke computer models. The modules described may be computer readable instructions encoded in a computer-readable medium. The term database is used to denote a data structure stored on a computer memory.

The initialization module 111 receives raw data in the form of operational metrics, customer related metrics, and financial metrics and through a user interface, allows a user to input model specification parameters, discussed in greater depth below. The initial run module 113 receives manifest variable data and model specification parameters and determines the estimated weights of the manifest variables as well as the path coefficients of the related latent variables. The initial run module 113 utilizes a novel LV-PLS algorithm called value-based weighting PLS. The initial run module 113 also returns updated model specification parameters that may be used by final run module 115 to calculate updated weights of manifest variables.

The final run module 115 receives the manifest variable data, updated model specification parameters and recalculates the weights of the manifest variables and the latent variable data. The final run module 115 is comprised of a value-based weighted LV-PLS calculator and a patient PLS regression calculator that receives the latent variable data and calculates the impacts of the predictor latent variables for each dependent latent. Final run module 115 is further operable to write various statistical measures to an output database 123.

The raw data is stored in raw data database 117. The raw data is provided by the business desiring an analysis of its performance metrics. As discussed, raw data may come in the form of operational metrics, financial metrics, and customer surveys. Raw data may be further divided into sub-aggregates. For example, a business having retail stores dispersed throughout the country may divide its stores by region, and then further by district, then by store. Thus, when the business enters operational metrics, financial metrics, and customer surveys, the data base may store the raw data generally, as well as by region, by district and/or by store. In this example, each store would have its own row of data in a data matrix. Each row is referred to as a unit of analysis.

Manifest variable data is stored in manifest variable database 119. Manifest variable database 119 may also include a manifest variable data matrix or table, wherein the rows of the matrix represent specific variables and the columns represent specific samples. Manifest variables are variables whose values are directly measured. The manifest variable data is derived from the raw data. Thus, the manifest variable data is indicative of the metrics that are capable of being measured, such as speed of a moving machine, throughput of a manufacturing process, time spent on hold by a caller, a customer evaluation of customer service, funds spent on marketing, or revenues received, and so forth. The manifest variables are used to calibrate the indicators, or latent variables. If desired, each manifest variable may have a manifest variable name associated with that variable. The names may be entered by a user or automatically chosen by the impact analysis machine. Both the initial run module 113 and final run module 115 communicate with the manifest variable database 119.

Latent variable data is stored in the latent variable database 120. Latent variables are variables that are not directly observable, but rather are inferred from manifest or observable variables. Predictor latent variables are used as indicators of the causal relationship with other dependent latent variables. Furthermore, a latent variable can be thought of as independent or predictor with respect to one variable, and dependent with respect to another. Thus, a latent variable may be expressed either as a linear combination of manifest variables, or a linear combination of predictor latent variables, if the latent variable is dependant.

Latent variables may be used to inform a call center how an average wait time of a caller will affect repeat business or how advertising expenditures spent on a particular medium at a particular time affected the sales of a particular product. The latent variable database 120 may also have latent variable names associated with each latent variable. Like the manifest variable database 119, the names may be chosen by the user or automatically assigned to a latent variable. Latent variable data is outputted to the latent variable database 120 by the final run module 115, and used as a parameter in the patient PLS module of the final run module 115. Thus, latent variable database 120 will communicate with the final run module 115, as the calculated latent variable data will be output by the final run module 115.

To perform its job, the impact analysis machine employs a computer-defined model that represents how the manifest variables and latent variables are related. The model represents how various measures or indicators are related and how strong are the respective predictive properties. In this regard, a typical company will have hundreds of different business metrics that can be ascertained from the raw operating data of the company. Given the large number of permutations involved it is essentially impossible through human mental effort to use all of these different business metrics in day-to-day decision making, and it is equally impossible to determine which of the many metrics are the optimal indicators for controlling a given industrial or commercial process. The model mechanizes this otherwise daunting analysis. It provides a predefined framework by which the manifest variables and latent variables may be systematically analyzed.

In a presently preferred form, the model comprises the manifest variables (MV), the latent variables (LV), a measurement model (MM) that specifies which manifest variables are used for which latent variables, and causal paths that specify cause and effect relationship information (e.g., which latent variable is the cause of the other). The model also includes additional parameters that are used by the initial run module 113 and final run module 115. Like the manifest variable database 119 and the latent variable database 120, the other components of the model are implemented as a database, referred to herein as the model specification parameter database 121.

Figure 2:
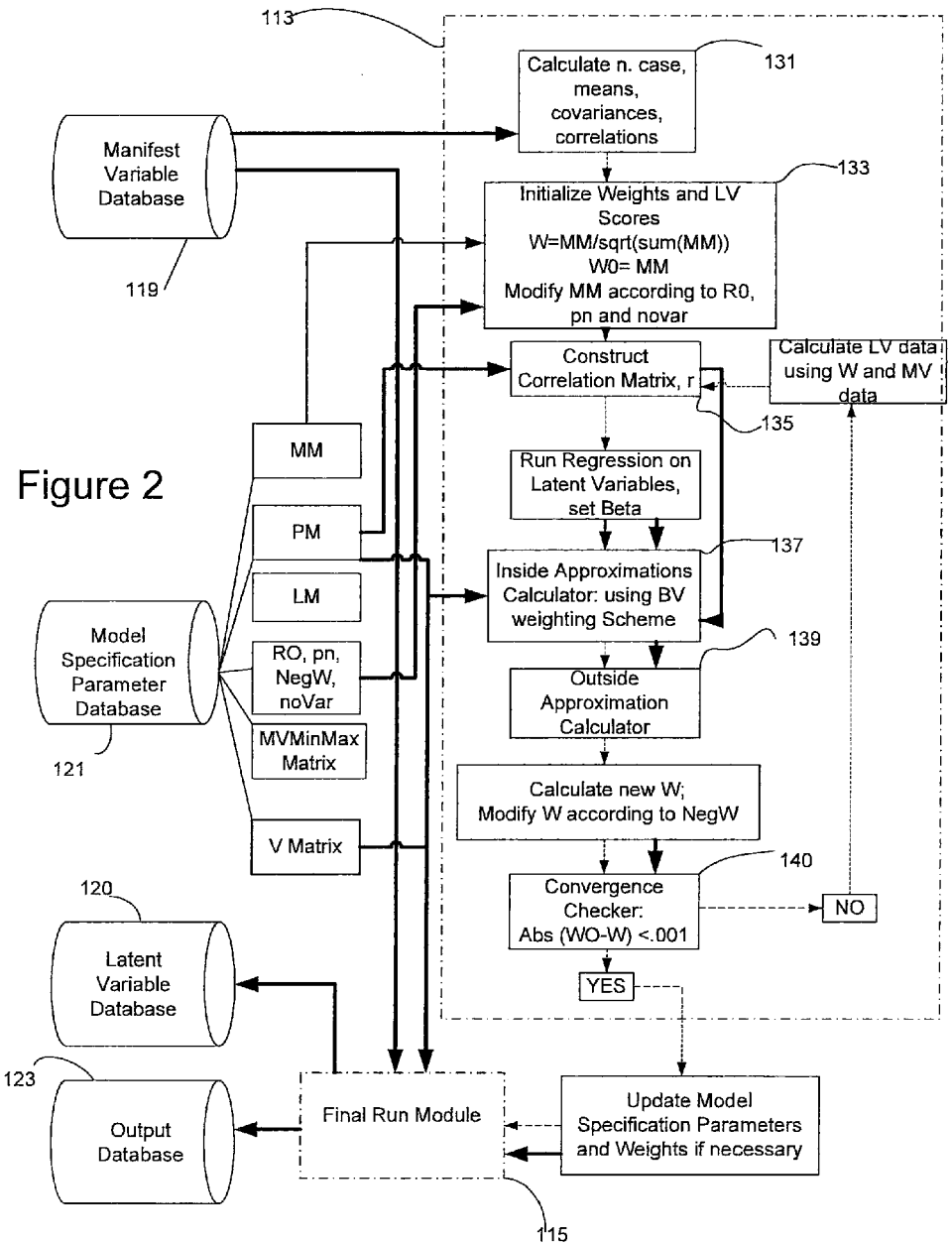
FIG. 2 is a more detailed view of the impact analysis machine.

FIG. 2 illustrates the model specification parameter database 121, which stores the model specification parameters used by the impact analysis machine. In the illustrated embodiment, model specification parameter database 121 stores measurement model specification matrix MM, path structure matrix PM, value-based weighting matrix V, modes of latent variables vector LV, MinMax of manifest variable matrix, and the optional parameters NegW, $R_0$, pn, and novar. The model specification parameters would typically be set by a user. Such user may be a consultant knowledgeable in statistical and econometric analysis, for example. FIG. 2 is intended to give an overview of the presently preferred model. Thus some of the more important model specification parameters have been illustrated. The model can include additional parameters (not illustrated) as will become apparent from the more detailed discussion below. Thus, for example, the model specification parameters $\epsilon$ and n.cv discussed below would also be stored in model specification parameter database 121.

FIG. 2 also illustrates in greater detail the iterative processes that are performed by the initial run module 113 to refine the values represented by the model. Essentially the initial run module 113 takes the initially supplied data and user-supplied parameter settings and performs a model optimization process whereby aggregate and sub-unit models based on the initially supplied data and settings are run and tested. The initial run module 113 thus identifies and fixes data problems, and identifies model improvement options, including providing diagnostic data useful in assessing the identified model improvements. As will be more fully explained below, after the initial run module 113 has performed its tasks, the user can re-specify various aspects of the model (deploying the initial run module 113 again if desired). Then the final run module 115 is used to supply quantitative data output used to control the manufacturing, industrial and/or commercial process.

To better understand how the initial run module 113 and final run module 115 operate, a more complete understanding of the data structures used to represent the model will now be presented.

Measurement Model Matrix MM

FIG. 3 depicts an exemplary measurement model matrix. Measurement model specification matrix MM is an m×k matrix. The rows of the matrix represent manifest variables stored in manifest variable database 119. The columns of measurement model specification matrix MM represent latent variables stored in latent variable database 120. Each element in measurement model specification matrix MM represents the existence of a causal relationship between the ith manifest variable and the jth latent variable. A manifest variable belongs to a latent variable if the manifest variable may be expressed as a linear component of the latent variable. Thus, the measurement model specification matrix MM may store a 1 if the ith manifest variable manifest variable belongs to the jth latent variable, and a 0 otherwise. For example, in FIG. 3, MV001, MV002, and MV003 all belong to LV0001.

Although each manifest variable should only belong to one latent variable, the system permits a manifest variable to initially belong to more than one latent variable, if it is unclear which latent variable the manifest variable is more causally related to. In the event a manifest variable belongs to more than one latent variable, the impact analysis machine may iteratively run alternate models to determine which latent variable owns the manifest variable. Model specification matrix MM may be used by the initial run module 113 to initialize weights and latent variable scores.

Path Structure Matrix PM

FIG. 4 depicts an exemplary path structure matrix PM. Path structure matrix PM is an k×k square matrix specifying the existence of a causal relationships between latent variables. The rows and columns are comprised of all the latent variables that will be analyzed by the impact analysis machine. The rows of path structure matrix PM represent dependent latent variables and the columns represent predictor latent variables. A first latent variable is said to have a causal relationship with a second latent variable if the second variable depends on the first variable. If a second variable depends on the first variable, a path is said to exist between the two variables. Paths between the variables may have three values. A 0 at element (i, j) indicates that the path can have any real value between the ith and jth variables. A 1 at element (i, j) indicates that the path coefficient between the ith and jth variables is positive. A −1 at element (i, j) indicates that the path coefficient between the ith and jth variables is negative. If no relationship exists between the ith and jth variable, then any other value may be placed at element (i, j). For exemplary purposes, a 9 may denote the non-existence of a relationship. It should be apparent that any value may be used to denote the existence or non-existence of a path. The elements of the path structure matrix PM may be provided by a consultant or operator of the impact analysis machine.

Value-Based Weighting Matrix V

FIG. 5 depicts an exemplary value-based weighting matrix V. Value-based weighting matrix V is an k×k square matrix, wherein each element specifies the relative importance of a predictor latent variable with respect to a corresponding dependent latent variable. The rows and columns are comprised of all the latent variables that will be analyzed by the impact analysis machine. The rows of value-based weighting matrix V represent dependant latent variables and the columns represent predictor latent variables. As mentioned, each element of the matrix will specify the importance of the predictor latent variable for determining the value of the dependent latent variable. Thus, each element (i, j) represents a prediction priority of the ith predictor latent variable for the jth dependant latent variable. The greater the value of the prediction priority, the more important a predictor variable is for the dependent latent variable. A 0 indicates that there is no relationship. Thus, any element in the path structure matrix PM having a value of 9 will have a value of 0 in value-based weighting matrix V. Value-based weighting matrix V is used by the inside approximation module 137 of initial run module 113 and the final run module 115 to rotate the latent variables. Initially, the values of value-based weighting matrix V is supplied by the operator of the machine or a consultant.

Latent Variable Vector LM

Latent variables may be classified to indicate the direction of the causal relationship between manifest variables and latent variables. In this regard, a latent variable is said to be reflective or "outward" if the direction of causal relationship is from the latent variable to the manifest variables. A reflective relationship assumes that one can observe and measure the sum of the true state and the measurement errors. A latent variable is said to be formative or "inward" if the direction of causal relationship is from the manifest variable to the latent variable. In the presently preferred embodiment, the system represents the causal relationship direction of the latent variable using a "mode-of-latent-variable" vector having length k. Each element of the vector represents whether the corresponding latent variable is reflective or formative. For exemplary purposes, a 0 indicates that the latent variable is reflective and a 1 means that the latent variable is formative.

Min Max Manifest Variable Matrix MinMax

FIG. 6 depicts an exemplary minimum and maximum of manifest variables matrix. Minimum and maximum (MinMax) of manifest variable matrix is a m×2 matrix, wherein the first column specifies the minimum possible value a manifest variable can have and the second column specifies the maximum possible value a manifest variable can have. The value in the matrix is not necessarily determined from the raw data, but is determined by the actual minimum and maximum possible values. For example, consider a call center optimizing application utilizing the impact analysis machine. If the call center has 10 open call stations, but there have never been more than 8 operators at a given time, the maximum value will be 10. Similarly, if the call center has never had less than two employees present, the minimum value will be 0. The MinMax manifest variable matrix is used so that the raw data can be easily converted to a scale. For example, a 0 to 100 scale may be used for all inputted raw data.

Additional Model Specification Parameters

NegW is a parameter set by a user to tell the impact analysis machine how to treat negative weights. For example, if NegW is set to 1 then the machine will treat the values all negative weights as 0 and if NegW is set to 0 the impact analysis machine will use the aggregated estimates for the values of the negative weights.

R0 is a parameter set by a user to inform the impact analysis machine how to treat non-overlapping variables. A portion of the latent variables may only be applicable to specific groups of analysis units and only some of the manifest variables. Thus, the latent variables defined by the manifest variables may be mutually exclusive. In such a case, the traditional covariance and correlation matrices needed by the initial run module 113 are not calculated. The impact analysis machine may instead treat these variables as independent because of their mutual exclusivity. The impact analysis machine may then replace the non-calculable covariance and correlation coefficients with zeros. Alternatively, the impact analysis machine may produce an error message. Thus, the user may set R0 to 1 to instruct the impact analysis machine to execute the covariance/correlation replacements, and 0 to instruct the impact analysis machine to provide an error message.

Pn is another parameter set by the user that is stored in model specification parameter database 121. Pn represents the minimum acceptable pairwise sample size. If a pair of variables has a sample size that is too small, statistics such as correlation and covariance will not be statistically stable. Thus, the user may set Pn to a constant k, and if two variables have a sample size less than k when paired, the impact analysis machine will flag the pair of variables. The initialization module 111 will analyze the remaining variables in relation to the flagged pair of variables. If initialization module 111 determines that either of the variables have a consistently low paired sampling sizes with the remaining variables, the initialization module 111 will remove the variable from the sample and cause the initial run module 113 and final run module 115 to make alternative determinations without the flagged variable. The initial run module 113 and final run module 115 may also make determinations with the flagged variable. The initialization module 111 may be configured to alert the user that the final determinations or reports have been produced with and without the flagged variable.

NoVar is another model parameter stored in model specification parameter database 121 that may be set by the user. NoVar sets the treatment of a variable that is constant. If a variable is constant then the variable cannot be used for modeling and should be excluded from the analysis. The initialization module 111 analyzes the raw data to determine which variables are constant when analyzing the basic descriptive statistics of the raw data or a sub unit of the raw data. Further, a variable may have sufficient variance when viewed in relation to the entire raw data set, but may be constant when paired with a subset of variables. In either case, NoVar may be set to 1 or 0, wherein 0 indicates that the correlation coefficient for the constant variable is set to 0, and a 1 indicates that the variable should be excluded from calculations.

A model parameter $\epsilon$ is stored in model specification parameter database 121. $\epsilon$ is a small constant used by patient PLS regression calculator of the final run module 115 as a constant to shrink the learning. An exemplary value of $\epsilon$ is 0.0001.

n.cv is another parameter stored in model specification parameter database 121. This parameter may be set by a user or be a assigned a default value by the developer of the impact analysis machine. n.cv is used for n.cv-fold cross-validation by the patient PLS regression calculator. n.cv is set to the amount of iterations that are to be run using the same model on a subset of the data.

With the above understanding of the primary data structures involved in representing the model employed by the impact analysis machine, the following will present a more detailed discussion of the initial run module 113 and final run module 115 and their operation.

Details of Initial Run Module 113

One of the important functions of the initial run module 113 is to estimate PLS weights. Initial run module 113 is configured to run a novel algorithm named value-based weighting PLS. Value-based weighting PLS allows initial run module 113 to run in two modes, one mode where the priority value matrix is undefined, and a second mode where the priority value matrix is defined by the user. Generally, the value-based weighting PLS model may be defined as:

1. Initialize weights and LV scores.

$$w_i = w_{i0}, \sum_{i=1}^{k_i} w_i^2 = 1$$

where $k_i$ is the number of manifest variables of $\eta_i$ $\eta_i = w_i' y_i$ where $y_i$ is the manifest variables of $\eta_i$ 2. Run inner model and estimate path coefficients and latent variable correlation coefficients.

$$\eta_i = \sum_{k \in P(i)} \beta_{ik} \eta_k$$

$$r_{ij} = \text{Corr}(\eta_i, \eta_j) \text{ for all } i \text{ and } j, i \neq j$$

3. Inside Approximation—Approximate the LVs by Business Value-based weighting scheme.

If the vector of priority values for $\eta_i$, $v_i$, is not given, $$\hat{\eta}_i = \sum_{k \in P(i)} \beta_{ik} \eta_k + \sum_{g \in D(i)} r_{gi} \eta_g \text{ with } \sum_{k \in P(i)} \beta_{ik}^2 + \sum_{g \in D(i)} r_{gi}^2 = 1$$

Else, $$\hat{\eta}_i = \sum_{k \in P(i)} \beta_{ik} \eta_k + \sum_{g \in D(i)} v_{gi} \eta_g \text{ with } \sum_{k \in P(i)} \beta_{ik}^2 + \sum_{g \in D(i)} v_{gi}^2 = 1$$

4. Outside Approximation—Calculate the loadings by the regression coefficients of the inside-approximated LV on its manifest variables, and update the LV scores by using those loadings as the PLS weights.

$$y_j = \lambda_{ji} \hat{\eta}_i$$

$$w_i = \lambda_i, \sum_{i=1}^{k_i} w_i^2 = 1$$

where $k_i$ is the number of manifest variables of ▯

$\eta_i = w_i' y_i$ where $y_i$ is the manifest variables of ▯

5. Repeat Step 3 and 4 until convergence of the estimated PLS weights.

Stop iterations if $|w^t - w^{t-1}| < \delta$ for all PLS weights, where $\delta$ is a small number, for example, 0.001

6. At convergence, estimate other parameters such as path coefficients and loadings by using the original manifest variables and the estimated LV scores.

FIG. 2 depicts the value-based weighting PLS applied to initial run module 113. Initial run module 113 receives input from the manifest variable database 119 and the model specification parameter database 121 to calculate the estimated weights for each latent variable. Initial run module 113 is configured to initialize weights and latent variable scores, estimate path coefficient and latent variable correlation coefficients, approximate the latent variables using a value-based weighting scheme, calculate the loadings by the regression coefficients of the inside-approximated latent variables on their manifest variables and updating the latent variable scores using the loadings as the calculated weights. Initial run module 113 may also be configured to automatically update model specification parameters stored in model specification parameter database 121 upon determining that a more correct model exists.

Once the model specification parameters and raw data have been entered into the impact analysis machine, the initial run module 113 will first calculate statistics used by initial run module 113. Initial run module 113 will receive manifest variable data from manifest variable database 119, and run an initial statistical analysis on the manifest variable data, including the number of valid cases, means, variances and correlations of the manifest variable data. The initial statistics are used by various components of the initial run module 113.

Initial run module 113 has a latent variable score and weight initialization module 133. Latent variable score and weight initialization module 133 first initializes the weights of the manifest variables using the formula $$w_i = w_{i0}, \sum_{i=1}^{k_i} w_i^2 = 1$$

where $k_i$ is the number of manifest variables of $\eta_i$. $\eta_i$ is the ith latent variable. Thus, the weights of all the manifest variables belonging to a latent variable will be equally set so that the sum of their squares equals one. Latent variable score and weight initialization module 133 will initialize all latent variables so that $\eta_i = w_i' y_i$ where $y_i$ is the nth manifest variable belonging to $\eta_i$.

Initial run module 113 further includes a coefficient estimation module 135 that estimates path coefficients and latent variable correlation coefficients. Coefficient estimation module 135 receives the initialized latent variable scores from the latent variable score and weight initialization module 133 and receives the path structure matrix PM from the model specification module. Coefficient initialization module 135 uses the received inputs to construct a path coefficient matrix, $\beta$, and a correlation matrix, r. Path coefficient matrix β is populated by running a regression on each initialized latent variable $\eta_i$, such that $$\eta_i = \sum_{k \in P(i)} \beta_{ik} \eta_k$$

where P(i) denotes the set of indexes of the predictors of a latent variable $\eta_i$. Correlation matrix r is set by determining the correlations of all pairs of latent variables $\eta_i$ and $\eta_j$, such that $r_{ij}$=Corr($\eta_i,\eta_j$) for all i and j, i≠j. Coefficient initialization module 135 receives the path structure matrix PM from the model specification parameter database 121 and uses path structure matrix PM to initially determine which latent variables are correlated by determining which elements of path structure matrix PM have a value of 1. Correlation matrix r and path coefficient matrix β are communicated to the inside approximation module 137.

Inside approximation module 137 receives the value based weighting matrix from the model specification parameter database 121 and the correlation matrix r and path coefficient matrix β from the coefficient initialization module 135. Inside approximation module 137 approximates the values of the latent variables, $\hat{\eta}_i$. Inside approximation module 137 is operable in two modes. In the first mode, the priority value weights in the value based weighting matrix are undefined. In this mode, the operator has chosen to run the impact analysis machine without providing a priority value matrix. In this mode $\hat{\eta}_i$, is approximated by the equation $$\hat{\eta}_i = \sum_{k \in P(i)} \beta_{ik} \eta_k + \sum_{g \in D(i)} r_{gi} \eta_g$$

where $$\sum_{k \in P(i)} \beta_{ik}^2 + \sum_{g \in D(i)} r_{gi}^2 = 1.$$

Again, P(i) denotes the set of indexes of the predictors of a latent variable $\eta_i$. D(i) denotes the set of the indexes of the dependent latent variables of $\eta_i$.

In the second mode, the priority value matrix is defined. The inside approximation module 137 treats every column of the value based weighting matrix as a vector, $v_j$, where each vector $v_j$ corresponds to a latent variable $\eta_j$. In the second mode $\hat{\eta}_i$ is approximated by the equation $$\hat{\eta}_i = \sum_{k \in P(i)} \beta_{ik} \eta_k + \sum_{g \in D(i)} v_{gi} \eta_g$$
where
$$\sum_{k \in P(i)} \beta_{ik}^2 + \sum_{g \in D(i)} v_{gi}^2 = 1.$$

In the second mode, the latent variables are rotated based upon the prediction priorities set in each value based vector, v. Thus, the resulting weights are optimized to satisfy the predetermined prediction priorities. Although there are many ways to rotate a latent variable, previous methods rotate the "axes" or "dimensions" of the latent variables mainly to enhance the interpretability of the latent variables themselves without consideration of the relationships between other latent variables. Furthermore, in the second mode, the user can define different prediction priorities for different predictor latent variables so that each latent variable can have its own prediction priorities, while other latent variables may have separate prediction priorities. This makes it possible to optimize the prediction of each latent variable based on its own prediction priorities. The approximated latent variables are communicated to the outside approximation module 139.

The outside approximation module 139 receives the approximated latent variables from the inside approximation module 137 and calculates the loadings using the regression coefficients of the approximated latent variables and further updates the latent variable scores by using the loadings as the approximated weights. The outside approximation module 139 is configured to operate using the standard outside approximation technique used in most PLS calculators. Thus, the outside approximation module 139 is configured to calculate the following:

$$y_j = \lambda_{ji} \hat{\eta}_i;$$

$$w_i = \lambda_i, \sum_{i=1}^{k_i} w_i^2 = 1$$

where $k_i$ is the number of manifest variables of $h_i$;
$\eta_i = w_i' y_i$ where $y_i$ is the manifest variables of $h_i$.

The initial run module 113 runs iteratively until the estimated weights converge. The convergence check module 140 receives the calculated weights from the outside approximation module 139. A parameter δ may be set to a small number, wherein the initialization module 111 stops iteratively running when $|w^t - w^{t-1}| \leq \delta$ for all approximated weights.

Once the calculated weights converge, other values may be calculated from the outputs of the initial run module 113 components. For example, path coefficients and loadings may be calculated using the original manifest variable data and the estimated latent variable scores.

Referring back to the model specification parameters, specifically, NegW, $R_0$, Pn, and novar, depending on the settings of the specified parameters, impact analysis machine may operate slightly differently. For example, if NegW is set to 0 or 1, the initial run module 113 checks the signs of the weights, and executes the defined NegW option. Or if covariance and correlation coefficients cannot be calculated due to no overlapping cases, too small pair wise sample sizes, or no variance of a variable when paired, the initial run module 113 will proceed according to the settings of $R_0$, Pn, and novar.

When the convergence check module 140 determines that the weights have not converged, the initial run module 113 may be configured to automatically update the measurement model specification matrix MM and the path structure matrix PM based on the calculated covariance and correlation coefficients.

Additionally, as stated above, when the user is defining the measurement model specification matrix MM, a manifest variable may be set so as to belong to more than one latent variable. In this instance, initial run module 113 runs using alternative model specification matrices, each one designating the manifest variable belonging to a different latent variable.

Finally, initial run module 113 may be configured to report additional useful statistics to the user. For example, the initial run module 113 may be configured to calculate and output Chonbach's alpha, the loadings and communalities, the correlation coefficients between all the manifest variables and the latent variables. Furthermore, initial run module 113 may be configured to flag a manifest variable that has a correlation coefficient with a latent variable that the manifest variable does not belong to which is greater in value than the correlation coefficient with the latent variable that the manifest variable is said to belong to. In this configuration, the initial run module 113 may communicate with the model specification parameter database 121 to reconfigure the measurement model specification matrix MM accordingly and to run the data through the initial run module 113 using the new parameters. Alternatively, initial run module 113 may update the model specification parameter database 121, and the new measurement model specification matrix MM may be used by the final run module 115.

Details of Final Run Module 115

Figure 7:
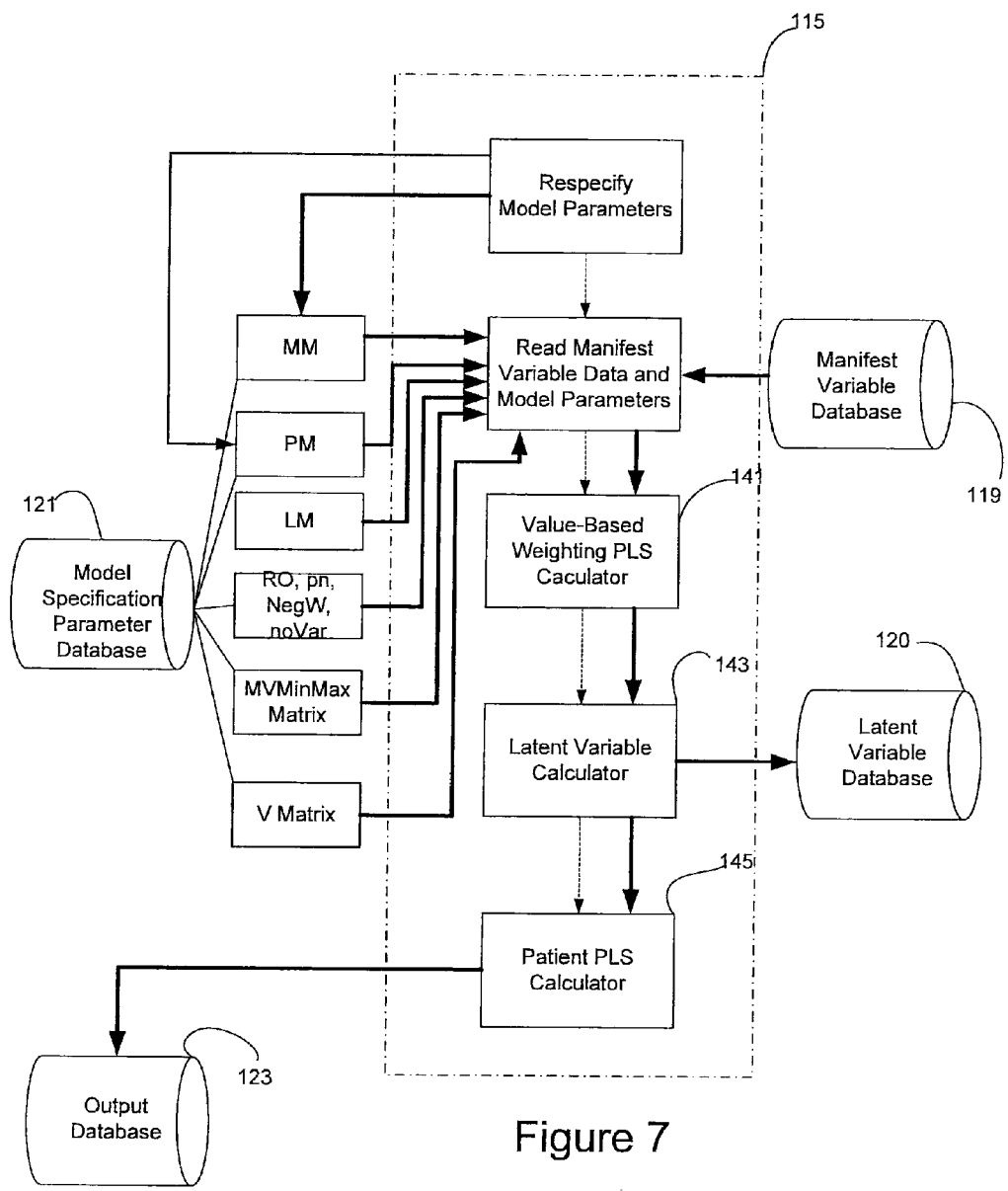
FIG. 7 is a system level architecture of the final run module 115.

Illustrated in FIG. 7, the final run module 115 receives manifest variable data from the manifest variable data database, the respecified model specification parameters from the model specification parameter database 121, including the path structure matrix PM and measurement model specification matrix MM. The final run module 115 estimates the path coefficients by implementation of a patient PLS regression. Final run module 115 overcomes the deficiencies of prior PLS determinators by the implementation of a novel regression model which combines recent developments in machine learning and PLS regression.

Final run module 115 may employ a value-based weighting PLS calculator having all of the components of the initial run module 113, described above, a latent variable score calculator, and a patient PLS regression calculator. Upon initialization, PLS calculation module will execute all the steps executed in the initial run module 113 to obtain the estimated weights using the updated model specification parameters. The estimated weights are stored in a weight matrix W. In an alternative embodiment, the initial run module 113 may be run twice, once using the original model specification parameters and a second time using the updated model specification parameters. Of course, if after the initial run no model specification parameters need to be updated, then a second estimation of weights is not necessary and is superfluous.

Once the value-based weighting PLS calculator has determined new weights using the updated model specification parameters, latent variable calculator receives weight matrix W and manifest variable data from manifest variable database 119 and calculates latent variable scores using the weighted combinations of the manifest variables. The latent variable scores are estimated using the following equation. $\hat{\eta}=W'y$, where W is the matrix of weights, y represents the manifest variables, and $\hat{\eta}$ represents the latent variables. The resulting latent variable scores are stored in latent variable database 120.

Figure 8:
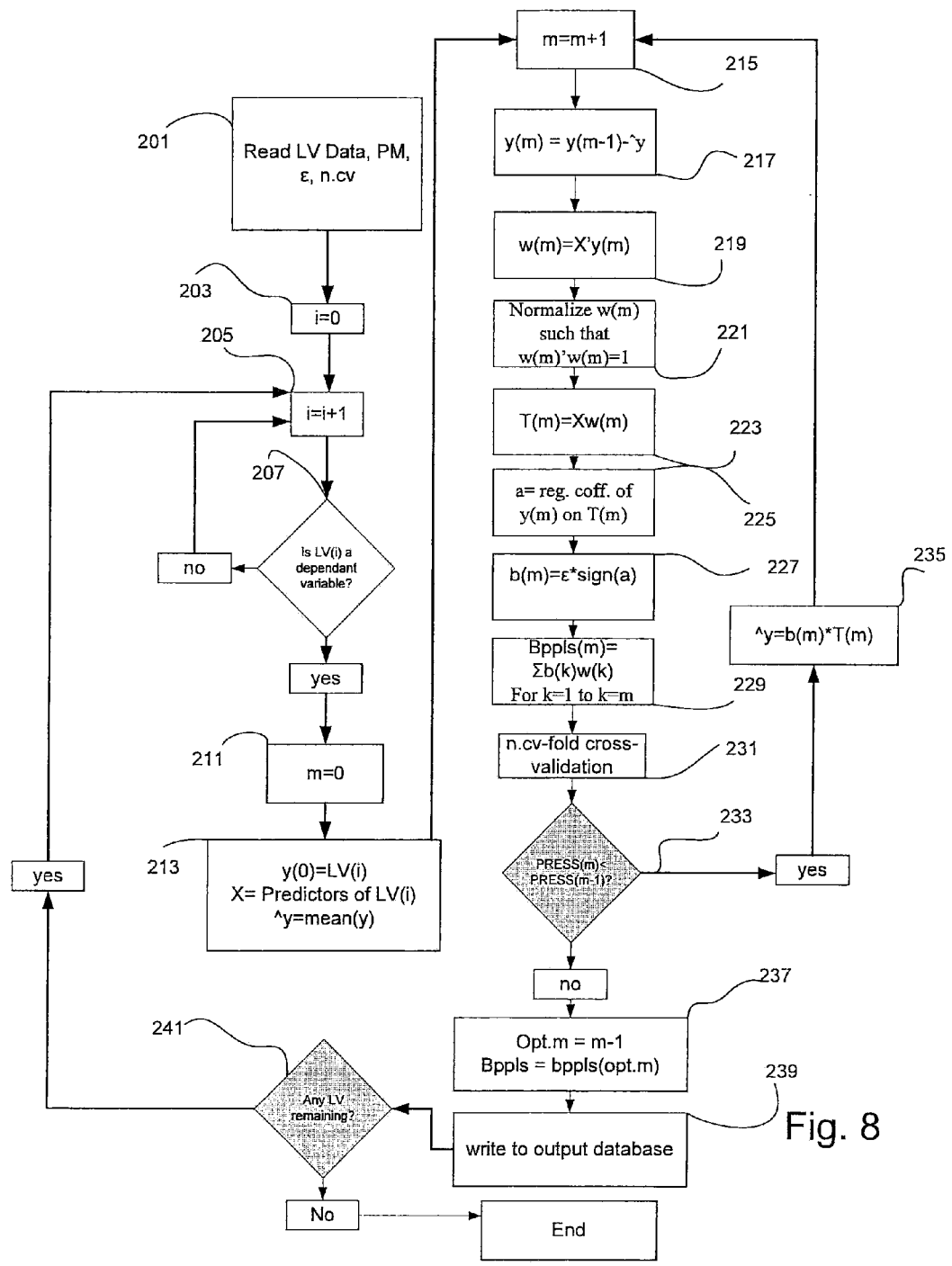
FIG. 8 is a flow diagram of the patient PLS regression algorithm

Patient PLS regression calculator receives the latent variable data and model specification parameters and uses a novel PLS regression method, illustrated in FIG. 8, to calculate the path coefficients, or impacts, of the dependent latent variable data. The method embodied in patient PLS regression calculator of the final run module 115 combines techniques such as boosting, forward stagewise additive modeling, and slow learning to overcome the primary limitations of traditional PLS regression algorithms. By implementing these learning techniques the final run module 115 is able to fine-tune the estimation of PLS path coefficients.

Boosting is a machine learning technique disclosed in Yoav Freund and Robert E. Schapire. A decision-theoretic generalization of on-line learning and an application to boosting. *Journal of Computer and System Sciences*, 55(1):119-139, 1997. Boosting is a learning technique used to fit an additive expansion in a set of elementary basis functions, that is, many "weak" learners. A "weak" learner is model that has an error rate that is slightly better than random guessing. Weak learning models can use trees or PLS operator. Boosting models are typically fitted by minimizing a loss function averaged over the training data, such as a squared-error or a likelihood based loss function:

$$\min_{\{b_k, w_k\}_1^M} \sum_{i=1}^{N} L\left(y_i, \sum_{k=1}^{M} b_k f(x_i; w_k)\right) \quad \text{(EQ. 1)}$$

For many loss and/or basis functions, however, minimization requires computationally intensive numerical optimization techniques. The following equation provides a feasible alternative to rapidly solve the subproblem of fitting a single basis function:

$$\min_{\{b, w\}} \sum_{i=1}^{N} L(y_i, bf(x_i; w)) \quad \text{(EQ. 2)}$$

Friedman, J, "Greedy function approximation: a gradient boosting machine, Annals of Statistics," (2001) may be consulted for greater detail on boosting.

Forward stagewise additive modeling is a technique that can be used to approximate a solution to equation 1 by sequentially adding new basis functions to the expansion without adjusting the parameters and coefficients of those that have already been added. Forward stagewise learning models provide a convenient means to implement a slow learning technique, which will be described in greater detail below. The following details the basic operation of the forward stagewise algorithm as described in Hastie, T., R. Tibshirani, and J. Friedman, *The Elements of Statistical Learning*, Springer, New York (2001):

1. Initialize $f_0(x)=0$;
2. For m=1 to M:
   (a) Compute:

$$(\beta_m, \gamma_m) = \operatorname*{argmin}_{\beta, \lambda} \sum_{i=1}^{N} L(y_i, f_{m-1}(x_i) + \beta b(x_i; \gamma));$$

(b) Set $f_m(x)=f_{m-1}(x)+\beta_m b(x; \gamma_m)$

Slow learning is a technique used to slow down the prediction process. This allows the patient PLS regression calculator to fine tune the optimization process. An additive model such as the equation $$y = \sum_{j=1}^{M} b_j f(X; w_j)$$

can increase its prediction power with training data by adding more terms, i.e. choosing very large M. In traditional PLS regression, choosing the maximum number of components will maximize the prediction power, $R^2$. This strategy not only creates less reliable regression coefficients when the data is multicollinear, but also creates an overfitting problem.

By using the cross-validation to choose the optimal number of components, the overfitting problem may be minimized. "Early stopping" by cross-validation results in the shrinkage of coefficients. In addition, the Friedman text, *The Elements of Statistical Learning*, showed that slowing the learning rate by using very small shrinkage factor of less than 0.1, in updating the equation $$y = \sum_{j=1}^{M} b_j f(X; w_j)$$

can dramatically improve the cross-validation error and therefore minimize the overfitting. According to this strategy, $f(x,w_j)$ at the jth iteration is determined by minimizing the following equation:

$$\min_{a,w} \sum_{i=1}^{N} L(y_i, f_{m-1,i}, a(x_i; w_m))$$

where $$y_{m-1} = y_{m-2} - \sum_{j=1}^{m-1} b_j f(x, w_j)$$

And the equation is updated by:

$$y = \sum_{j=1}^{m-1} b_j f(x, w_j) + b_m f(x, w_j)$$

where $b_m = \epsilon \cdot \text{sign}(a)$ and $\epsilon > 0$ is a small constant.

Patient PLS regression calculator combines the three described learning models with a PLS regression algorithm to estimate the path coefficients of the predictor variables. Applying the three learning techniques discussed above, the patient PLS algorithm may be generally described as:

1. Use PLS operator as the "basis" function, $\eta(X; w)$ $\eta(X;w)=Xw$ where $w \propto x'y$ and $w'w=1$ 2. Use Least Squares as the loss function $$\min_{a,w_m} \sum_{i=1}^{N} [y_{(m-1),i} - af(X_i; w_m)]^2$$

where $$y_{(m-1)} = y_{m-2} - \sum_{j=1}^{m-1} b_j f(x, w_j)$$

3. Shrink the learning by $b_m = \epsilon \cdot \text{sign}(a)$, and $\epsilon > 0$ is a small constant 4. Calculate the path coefficient at the m-th iteration, $$b_{ppls}^{(m)} = \sum_{j=1}^{m} b_j \cdot w_j.$$

When applying the constraints, check the signs of $b_{ppls}^{(m)}$ and set $w_j = 0$ for those coefficients which do not meet the constraint condition.

5. At each iteration, m, calculate PRediction Error Sum of Squares (PRESS) from the testing samples of cross-validation, and stop the iteration when PRESS is minimized, m=m*.

6. Calculate the path coefficients as $$b_{ppls} = \sum_{j=1}^{m^*} b_j \cdot w_j$$

where $b_j$ is a scalar and $w_j$ is a vector of length k=the number of x variables.

At step 201, the patient PLS regression calculator receives the path structure matrix PM from the model specification parameter database 121, and the calculated latent variables from the latent variable score calculator 143.

Patient PLS regression calculator 145, upon receiving all necessary data, will determine which latent variables depend on at least one other variable. If a latent variable is independent, then final run module 115 will not run a regression on the independent latent variable. If, however, the latent variable is dependent, then final run module 115 will run a regression on the latent variable. Patient PLS regression calculator may use the path structure matrix PM to determine the dependency of a latent variable. The following regression will be run on each dependent latent variable.

Upon determining the ith latent variable, LV(i), is dependent, final run module 115 will set y(0)=LV(i), X to the predictor variables of LV(i), and ŷ=mean(y). X is a matrix of latent variables used to predict LV(i), which is a subset of latent variable database 120. The foregoing is used to initialize the latent variable data so that a regression of y may be calculated. Also, a variable, m, may be set to 0 to initialize a counter for the regression.

Next patient PLS regression calculator will run the following steps for each regression of a dependent latent variable LV(i):

215. m=m+1;
217. y(m)=y(m−1)−ŷ;
219. w(m)=X'y(m);
221. Normalize w(m) so that w(m)'w(m)=1;
223. T(m)=Xw(m);
225. a=regression coefficient of y(m) on T(m);
227. b(m)=ϵ*sign(a);
229.

$$b_{ppls}(m) = \sum_{k=1}^{m} b(k)w(k);$$

231. n.cv-fold cross validation;
233. if (PRESS(m)<PRESS(m−1));
235. Then (ŷ=b(m)*T(m)) and go to step 215);

237. Else opt.m=m−1 and b.ppls=b.ppls(opt.m);
239. Write to output database 123 and end.

Patient PLS regression calculator runs iteratively for each dependent latent variable until the cross-validation sum of squared prediction errors (PRESS) is minimized. Once the PRESS is minimized, then the Patient PLS regression calculator will run using the next dependent latent variable.

After each dependent latent variable has been run through the patient PLS regression calculator, output database 123 may be populated with the following information: the means and standard deviations of all manifest variables and latent variables, the PLS weights for each latent variable and the PLS loadings for each latent variable, communalities, the correlations of the latent variables to one another, and the correlations between manifest variables and latent variables, all path coefficients, $R^2$, multicolinearity diagnostics, RMR, PRESS value for each latent variable, and a text table with modeling log file. The modeling log file provides information relating to the modifications made to model specification parameters and what improvements could be further made to the model parameters. Furthermore, output database 123 may store any error messages produced by the statistical impact analysis machine. Output database 123 may be configured to store results from final run module 115, as well as initial run module 113.

Use Case Examples of the Impact Analysis Machine

The impact analysis machine may be used to optimize the performance of a variety of different controlled manufacturing, industrial or commercial processes. By way of illustration, three different examples employing the impact analysis machine are presented below. It will be understood that these are merely examples as numerous other manufacturing, industrial and/or commercial processes are also possible.

Optimizing Use of Resources within a Call Center

Figure 9:
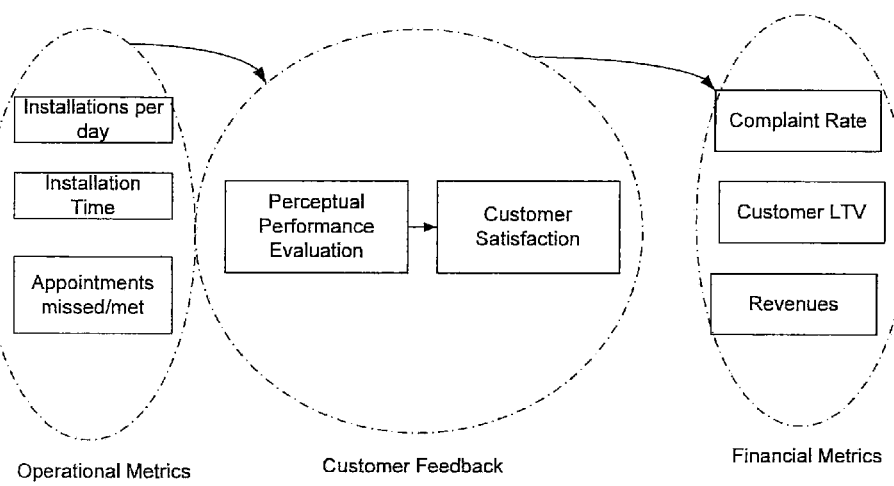
FIG. 9 is a depiction of various metrics in a call center scenario, useful in understanding a first example of the impact analysis machine in use.

The impact analysis machine is configured to take a number of different metrics as inputs and to determine the impact of each metric on a business's overall performance. Referring to FIG. 9, a call center may record certain operational metrics such as the hold time for a caller, the handle time of a caller, the time of day the caller called and the amount of employees taking calls at the time the caller called. The majority of these metrics may be recorded automatically by the phone switching equipment at the call center. The call center may also collect customer satisfaction measures in the form of survey data from the caller. The customer satisfaction information may be collected during the phone call or after the phone call. The call center may also record financial data relating to incremental revenue, returning customers and customer lifetime value. Call centers can track their financial performance over time through a monitoring of financial measures that relate to the buying behavior of customers that have been served by the call center. Call centers also may track their performance over time through a monitoring of financial measures that relate to the buying behavior of customers that have been served by the call center.

The impact analysis machine takes input from call center operating metrics, call center customer satisfaction information and financial information for customers served by a call center and relates these distributions to yield insights that are used to set future performance levels within the call center. In another sense, the impact analysis machine will predict which metrics have the greatest impact on unquantifiable measures such as customer satisfaction or a decision of a customer to engage in repeat business. The machine may provide optimal levels of the various operating metrics to maximize the financial measures associated with customers interacting with the call center.

In the example above, the impact analysis machine determines how to optimize certain physical metrics to improve the overall performance of a business. For example, the call center management may desire to tune its call center performance for the average handle time metric. Raw data from each of the three sources is input to the machine. The machine is run with average handle time identified as the most important, or prioritized, metric. The impact analysis machine yields insight that identifies the relationships among the metrics, their relationship to customer perceptions and satisfaction and target metric's performance level relationship to a financial outcome. These outcomes are used to staff the call center and manage manpower issues such as breaks, meals, etc. In this example the machine could identify an average handle time of 2.5 minutes +/−20 seconds as an optimal level of performance.

Optimizing a Product Installation Process

Figure 10:
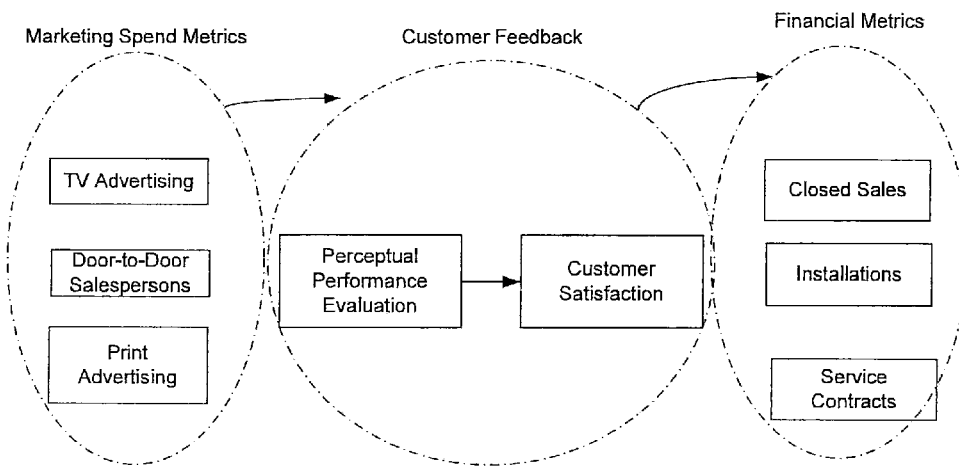
FIG. 10 is a depiction of various metrics in a installation service scenario, useful in understanding a second example of the impact analysis machine in use.

Alternatively, the impact analysis machine may be configured, as illustrated in FIG. 10, to assess the performance of an installation service provider, wherein the service entails an installation professional traveling to the site of the customer and installs a product or appliance. Companies manage the installation process with a series of metrics relating to the elapsed time for the installation, the number of appointments met and the number of installations completed by an installer in a period of time. Companies may collect this information through GPS systems installed in installation vehicles, through cellular communications devices assigned to installation personnel or through other unobtrusive means. Companies may also manage installations through the collection of customer feedback from customers who have recently had an installation completed.

The impact analysis machine receives raw data from the various sources and characterizes the data in such a way as to identify relationships and interactions among the metrics used to measure installation performance. Metrics coming from the company's trucks and communications devices are paired with feedback from customers who had installations done in the time period under evaluation. Various outcome metrics, financial and cost avoidance metrics for these types of customers are also merged into an analysis data set. The machine evaluates this paired data set and identifies causal relationships, interactions and associated outcomes. The impact machine can then output a set of relationships and optimal settings for both the installation metrics and customer perceptual evaluations that will maximize financial metrics and minimize cost metrics for the company.

Optimizing an Advertising Campaign

Figure 11:
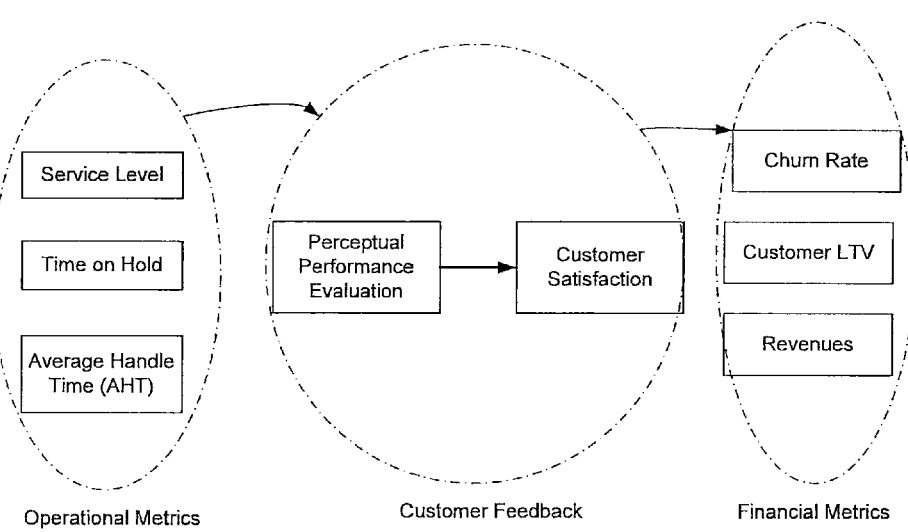
FIG. 11 is a depiction of various metrics in an advertising scenario, useful in understanding a third example of the impact analysis machine in use.

In another example, illustrated in FIG. 11, the impact analysis machine may be configured to determine the causal relationship between marketing expenditures and financial outcomes resulting therefrom. Currently, there is a lack of tools that effectively evaluate the return on investment of marketing expenditures. The impact analysis machine, however, may be configured to receive data inputs from various types of marketing and advertising spending, generally from marketing and sales budgets or management reports of expenditures, customer awareness, trial and usage evaluations, satisfaction and a number of business relevant financial indicators such as closed sales and contracts in service.

Within the frameworks provided above, it is apparent that metrics such as operational metrics or marketing metrics have a cause-and-effect relationship with customer satisfaction and customer satisfaction has a causal relationship with the financial metrics. Furthermore, the financial metrics are dependent on customer satisfaction. Thus, customer satisfaction may be further classified as a predictor latent variable and the financial metrics may be further classified as dependent latent variables. The impact analysis machine is configured to estimate the optimal values of latent variables. Latent variables may be expressed as the weighted average of the causally related manifest variables. Thus, the impact analysis machine is configured to output the optimal PLS weights of the manifest variables for each latent variable.

Figure 12:
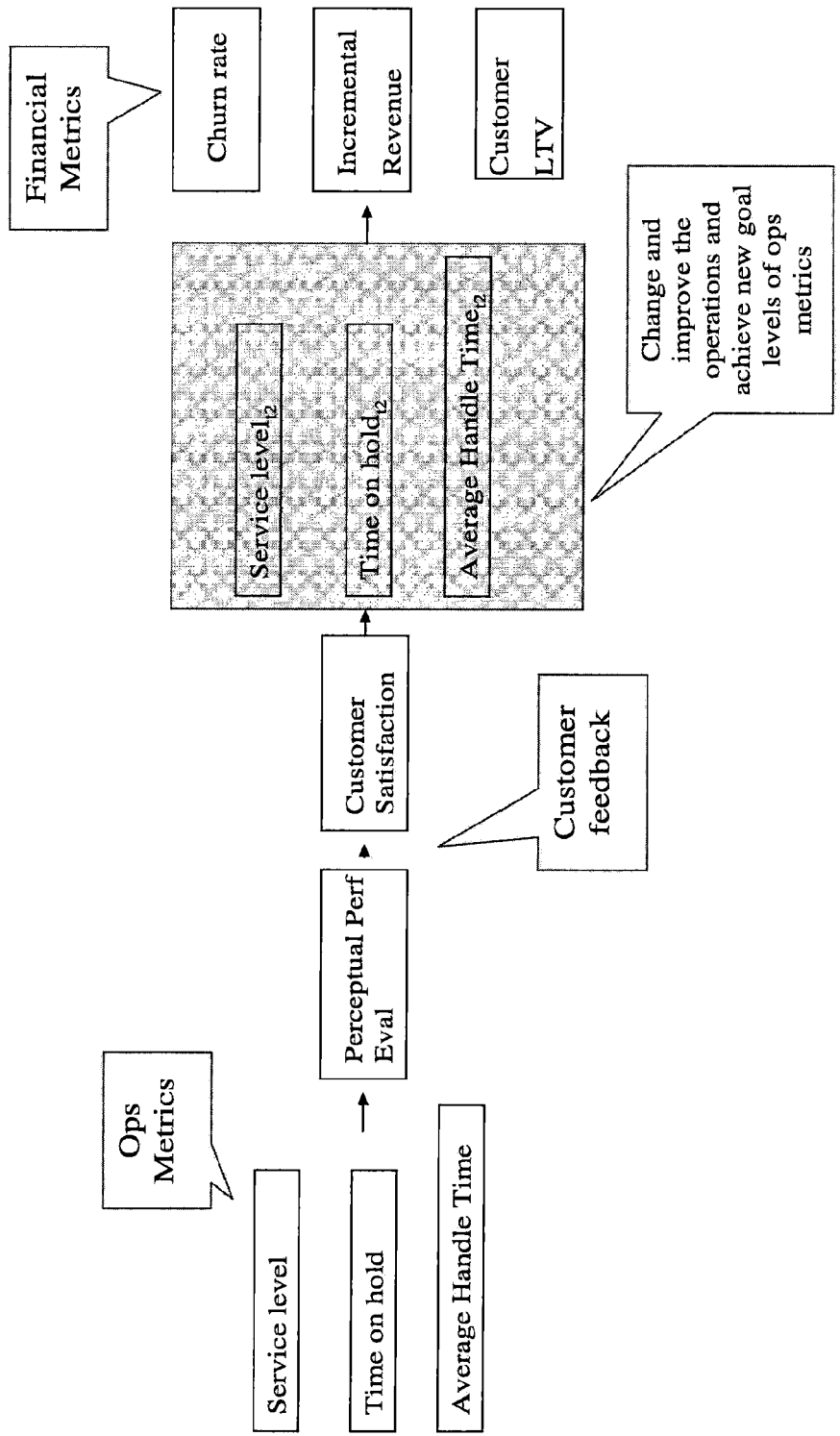
FIG. 12 is a depiction of various metrics as may be used to collect data for use in the statistical impact analysis machine.

The following will provide a functional example of the statistical impact machine. As discussed, the statistical impact machine may be used to analyze a call center. FIG. 12 depicts a scenario where a call center has collected operational metrics and customer feedback and subsequently changed its operations to achieve new operational metrics. Finally, the call center collects the financial metrics. As discussed, the raw data defining the manifest variable data may be collected by the use of surveys or various electronic means. The raw data is entered by the user into a computing device.

Figure 13:
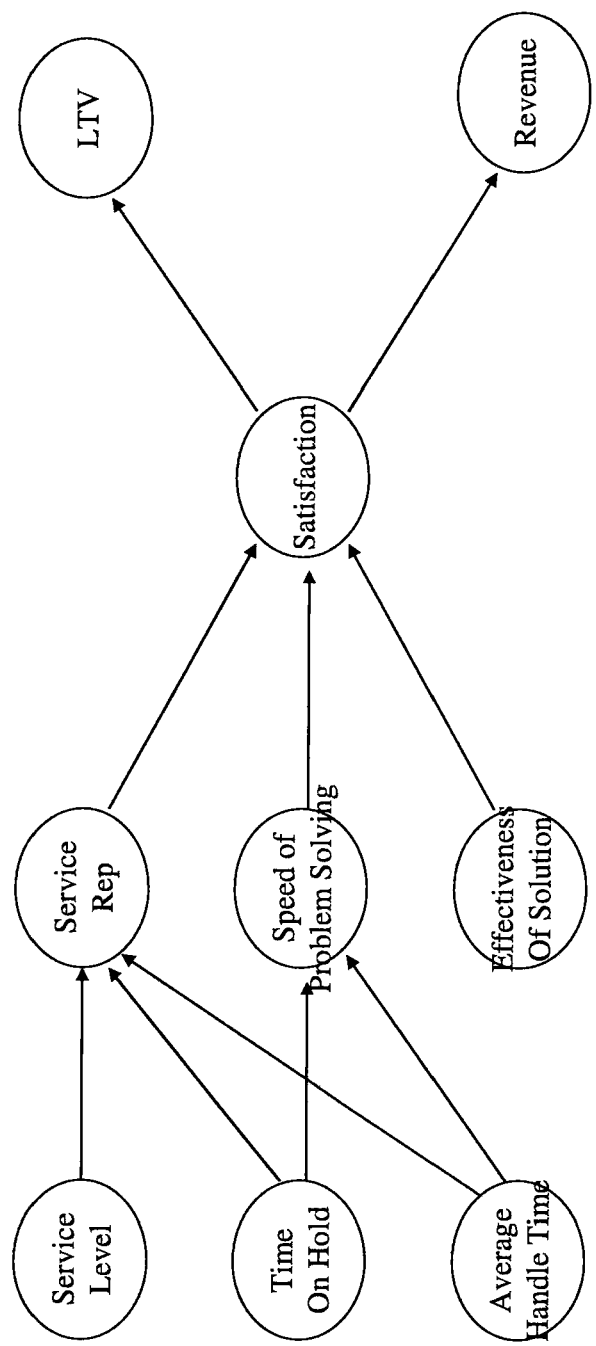
FIG. 13 is a model depicting the relationship between predictor latent variables and dependent latent variables.

FIG. 13 depicts a model that may be applied to the above example demonstrating which latent variables impact subsequent latent variables. For example, average handle time has an impact on the rating of a service representative and the speed of problem solving, while the effectiveness of the solution is unaffected by average handle time, service level or time on hold. As can be seen from FIG. 13, however, customer satisfaction is impacted by the speed of service, service rep and effectiveness of solution. Satisfaction drives revenue and a customer life time value (LTV).

FIG. 14 depicts an exemplary entry in manifest variable database 119. The manifest variable database is organized by manifest variable name. As can be seen, manifest variables such as calls answered, answer rate, average wait time, average handle time, and various survey questions are collected and organized. Each row in the matrix represents a unit of analysis. Having the manifest variable data, the operator must now enter the model specification parameters.

FIG. 15 depicts minimum maximum values of manifest variable matrix MinMax. In the embodiment, the values have been entered after the data is scaled. For example, the highest score for calls answered is 100, while the lowest score for average wait time is 0.

FIG. 16 depicts measurement model specification matrix MM. As can be seen, calls answered and answer rate belong to the latent variable ServiceLevel, time on hold and average wait time belong to the latent variable TimeOnHold, etc.

FIG. 17 depicts an exemplary path structure matrix PM. Path structure matrix PM essentially mirrors the model defined in FIG. 13, except for it defines the type of relationship or impact that an predictor latent variable has on a dependent latent variable. For example, service level has a positive relationship with ServiceRep, TimeOnHold has a negative relationship with ServiceRep and SpeedofProblemSolving, and AvgHandleTime can have either a negative or positive relationship with ServiceRep and SpeedofProblemSolving. Further down, Satisfaction can have either a negative or positive relationship with LTV and Revenue.

FIG. 18 depicts an exemplary value-based weighting matrix V. As can be seen from FIG. 18, the user has determined that TimeOnHold has greater impact on SpeedofProbSolving rather than ServiceRep and Satisfaction has greater impact on LTV rather than revenue.

FIG. 19 depicts an exemplary latent variable vector LV. As can be seen, TimeonHold is the only variable determined to be formative. The remaining variables have been determined to be reflective.

Having set the data structures of the model specification parameters, the operator may set the variable NegW, R0, NoVar and Pn. In this example, NegW, R0, and novar have been set to 1 and Pn has been set to 10. The initialization module 111 will then pass the defined model specification parameters discussed above to the initial run module 113.

The initial run module 113 receives the manifest variable data matrix and the model specification parameters. It uses the manifest variable data to calculate various statistics, including the means of each manifest variable, covariances of manifest variables, and the correlations of manifest variables. The initial run module will then iteratively run the business valued LV-PLS algorithm on the manifest variables using measurement model matrix and the value-based weighting matrix V. The primary results of initial run module are the value based PLS weights. FIG. 20 depicts an exemplary output of the initial run module 113. For example, Answer rate is the only variable impacting ServiceLevel. Thus, ServiceLevel=1.0*Answer rate. For TimeOnHold, average weight time is estimated to be more important than time on hold. For Satisfaction, a respondents response to question 7 is more important than question 6 or question 8. Because NegW was set to 1, any negative weight was zeroed out by initial run module.

Next, the model specification parameters may be re-specified to optimize the model. For example, it was determined by initial run module 113 that calls answered had no relationship (or a negative relationship) with service level. Thus, as can be seen in FIG. 21, the value of [ServiceLevel, CallsAnswered] is set to 0. The weights resulting from initial run module 113 are used to re-specify the entire measurement model matrix MM in this manner. Various statistics gathered during the initial run module 113 iterations may be used to automatically update the model specifications. The user may also manually re-specify any of the various model specification parameters after viewing the data produced by initial run module 113.

Final run module 115 receives the manifest variable data and the re-specified model specification parameters. Final run module then re-runs the value-based weighting LV-PLS algorithm, using the manifest variable data and the re-specified parameters. The latent variable calculator 143 then receives the manifest variables and the re-estimated PLS weights. It uses this data to calculate the latent variable scores and stores the calculated scores in latent variable database 120. FIG. 22 depicts the relationship between the manifest variable data, the re-specified measurement model matrix, the estimated PLS weights, and the latent variable scores. As can be seen, each latent variable is expressed as the weighted average of its manifest variables.

Final run module 115 then uses the latent variable scores and the model specification parameters to calculate the path coefficients between the latent variables. Final run module 115 utilizes the novel patient PLS algorithm described above. In this example, n.cv is set to 7, $\epsilon$ is set to 0.0001 and R0 is set to 1. The re-specified path structure matrix PM (if modified, else the original path structure matrix may be used) and the latent variable scores are used. From PM, each dependent variable may be identified. For each dependent variable, a regression is run until the PRESS value is minimized. FIG. 23 depicts a graph of Iterations to PRESS. From FIG. 23, it can be seen that for a specific dependent variable, the PRESS was minimized at iteration 721.

After the regression is run on a dependent variable, the path coefficients of the dependent variable are known and may be used to populate a path coefficient matrix, stored in output database 123. FIG. 24 depicts an exemplary path coefficient matrix. In this example, Satisfaction=0.3*CustRep+0.7*SpeedOfProbSolving+1.2*Effectiveness; LTV=23.1*Satisfaction; and Revenue=4.3*Satisfaction. Because R0 was set to 1, path coefficients of non-overlapping latent variables are set to 0. Not shown in the figure, final run module 115 may also output various statistics including R2s, collinearity diagnostics, PRESS and standard errors of path coefficients. Once the various statistics including the path coefficients are determined, control parameters may be selected to control, for example, the scheduling of call center operators or the amount of training to operators in order to optimize the most influential latent variables.

In an alternative embodiment, the statistical analysis machine may be configured to answer "what if" questions. A what if question is basically a hypothetical scenario that is entered into the impact analysis machine to determine the outcome on latent variables. Essentially, the hypothetical scenario is expressed in manifest variables and run with the raw data. Based on the hypothetical data, the statistical impact of the hypothetical situation may be evaluated. This may be used to further control the parameter selection basis for controlling a process.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A computer-implemented apparatus for controlling a process based on measured physical attributes, comprising:
    a non-transitory computer-readable storage medium having data structures for storing:
    (a) manifest variables based on said measured physical attributes;
    (b) latent variables representing causally related attributes associated with said manifest variables, the latent variables including predictor latent variables and dependent latent variables, wherein the dependent latent variables may be expressed as a linear combination of at least one predictor latent variables;
    (c) model specification parameters including a path structure parameter indicating causal path attributes to express the causal relationship between the predictor latent variables and the dependent latent variables and a value-based parameter indicating prediction priorities associated with weights of the dependent latent variables with respect to the predictor latent variables;
    a non-transitory computer-readable storage medium having encoded therein an initial run module that operates upon said data structures to provide estimates of weights associated with said latent variables;
    said initial run module providing estimates of weights of manifest variables with respect to latent variables by employing a computer-implemented value-based weighting partial least squares process employing an inside approximation weighting scheme utilizing the value based parameter thereby allowing optimization of each latent variable according to its own prediction priorities;
    the non-transitory computer-readable storage medium having encoded therein a final run module using said estimated weights and said manifest variables to calculate latent variable scores, wherein the latent variable scores are defined as weighted averages of manifest variables;
    said final run module employing a computer implemented patient partial least squares regression process that operates to calculate the path coefficients between predictor latent variables and dependent latent variables using the latent variable scores and path structure parameter;
    said final run module providing control parameter selections for controlling said process, where the control parameters are selected using the path coefficients associated with said latent variables.

2. The apparatus of claim 1 wherein said patient partial least squares regression employed by said final run module utilizes a boosting machine learning algorithm and a forward stagewise learning algorithm with shrinking to slow the regression process.

3. The apparatus of claim 2 wherein the boosting machine learning algorithm utilizes PLS operator as a weak learner.

4. The apparatus of claim 1 wherein the computer implemented value-based weighting patient least squares process employs an inside approximation weighting scheme utilizing a matrix of correlation coefficients of the latent variables to estimate the values of the latent variables when the prediction priorities of a latent variable are undefined.

5. The apparatus of claim 1 wherein the data structure for storing model specification parameters includes a measurement model specification matrix representing causal relationship between the manifest variables and the latent variables.

6. The apparatus of claim 1 wherein the model specification parameters are initially defined by a user of said apparatus.

7. The apparatus of claim 6 wherein the model specification parameters are automatically updated by the initial run module based on the initial estimated weights.

8. The apparatus of claim 7 wherein the initial run module re-estimates the weights of the manifest variables upon determining that the model specification parameters were automatically updated.

9. The apparatus of claim 1 wherein the final run module is operable to determine a correlation of a first latent variable to a second latent variable.

10. The apparatus of claim 1 wherein the final run module is operable to iteratively calculate a prediction error sum of squares and to cease iterations when the prediction error sum of squares is minimized.

11. A computer-implemented apparatus for controlling a process based on measured physical attributes, comprising:
    a non-transitory computer-readable storage medium storing a computer-defined model having data structures for storing:
    (a) manifest variables based on said measured physical attributes;
    (b) latent variables representing causally related attributes associated with said manifest variables, the latent variables including predictor latent variables and dependent latent variables, wherein the dependent latent variables may be expressed as a linear combination of at least one predictor latent variables;
    (c) model specification parameters including a path structure parameter indicating causal path attributes to express the causal relationship between the predictor latent variables and the dependent latent variables and a value-based parameter indicating prediction priorities associated with weights of the dependent latent variables with respect to the predictor latent variables;
    an initial run module that operates upon said model to provide initial estimates of weights of manifest variables associated with said latent variables;

said initial run module employing a computer-implemented value-based weighting partial least squares process to calculate inside approximations of the latent variables, wherein said initial run module is configured to rotate the latent variables based upon the prediction priorities which are used for said inside approximations of the latent variables; and a final run module that operates upon said model after said initial run module to provide estimates of path coefficients associated with said latent variables;

said final run module providing control parameter selections for controlling said process, where the control parameters are selected using the estimates of path coefficients associated with said latent variables.

12. The apparatus of claim 11 wherein said final run module employs a patient least squares regression model that utilizes a boosting machine learning algorithm, a forward stagewise learning algorithm with shrinking to slow the learning.

13. The apparatus of claim 12 wherein the boosting machine learning algorithm utilizes PLS operator as a weak learner.

14. The apparatus of claim 12 wherein the final run module further comprises a latent variable calculator receiving manifest variables from the data structure storing the manifest variables and the estimated weights from the initial run module and calculating latent variable scores by calculating the weighted average of the manifest variables.

15. The apparatus of claim 11 wherein the non-transitory computer-readable storage medium has a data structure for storing model specification parameters including a matrix representing relationship between the manifest variables and the latent variables.

16. The apparatus of claim 11 wherein the initial run module updates the model specification parameters after calculating the weights of manifest variables.

17. A computer-implemented apparatus for controlling a process based on measured physical attributes, comprising:

a non-transitory computer-readable storage medium having stored therein data structures storing:

(a) manifest variables based on said measured physical attributes;

(b) latent variables representing causally related attributes associated with said manifest variables, the latent variables including predictor latent variables and dependent latent variables, wherein the dependent latent variables may be expressed as a linear combination of at least one predictor latent variables;

(c) model specification parameters including a path structure parameter indicating causal path attributes to express the causal relationship between the predictor latent variables and the dependent latent variables and a value-based parameter indicating prediction priorities associated with weights of the dependent latent variables with respect to the predictor latent variables;

a non-transitory computer-readable storage medium having encoded therein a partial least squares calculator employing a computer-implemented value-based weighting partial least squares process to estimate weights of manifest variables with respect to latent variables;

the value-based weighting partial least squares process utilizing the value-based parameter to estimate the values of the latent variables;

the estimated values of the latent variables being used by the partial least squares calculator to estimate the weights of manifest variables;

the non-transitory computer-readable storage medium having encoded therein a latent variable calculator that receives manifest variables from the data structure storing said manifest variables and estimated weights from the partial least squares calculator and calculates a latent variable score by determining a weighted average of the manifest variables;

the non-transitory computer-readable storage medium having encoded therein a regression calculator employing a computer-implemented patient partial least squares regression process to calculate path coefficients between predictor latent variables and dependent latent variables using the latent variable scores and path structure parameter;

the patient partial least squares regression process utilizes a boosting machine learning algorithm and a forward stagewise learning algorithm with shrinking to slow the regression process; and the non-transitory computer-readable storage medium having a data structure for storing control parameter selections for controlling said process, where the control parameters are based on the correlation coefficients associated with said latent variables.

18. A computer-implemented method for controlling a process based on measured physical attributes, comprising:

receiving raw data representing the measured physical attributes;

initializing a manifest variable data structure residing on a computer memory for storing manifest variable data, deriving manifest variable data from the raw data and storing said manifest variables in the manifest variable data structure;

initializing a latent variable data structure residing on a computer memory for storing latent variables, latent variables including predictor latent variables and dependent latent variables, wherein the dependent latent variables may be expressed as a linear combination of at least one predictor latent variables;

initializing a model specification parameter data structure residing on a computer memory for storing model specification parameters, the model specification parameters including a path structure parameter indicating causal path attributes to express the causal relationship between the predictor latent variables and the dependent latent variables and a value-based parameter indicating prediction priorities associated with weights of the dependent latent variables with respect to the predictor latent variables;

estimating weights of manifest variables with respect to the latent variables by employing a value-based weighting partial least squares algorithm which utilizes the value-based parameter to estimate latent variables scores and utilizes the latent variable scores to estimate the weights of manifest variables;

calculating latent variable scores by calculating the weighted averages of manifest variables using said estimated weights and said manifest variables;

storing said latent variable scores in the latent variable data structure;

calculating path coefficients of predictor latent variables in relation to dependent latent variables by employing a patient partial least squares regression process that utilizes a boosting machine learning algorithm and a forward stagewise learning algorithm with shrinking to slow the regression process, wherein the patient partial least squares regression uses the latent variable scores and the path structure matrix to calculate the path coefficients; and controlling said process using control parameters, where the control parameters are based on the correlation coefficients associated with said latent variables.

19. The method of claim 18 further comprising:

updating the model specification parameters residing in the model specification parameter data structure according to the estimated weights.

20. The method of claim 19 further comprising:

re-estimating weights of manifest variables with respect to the latent variables by employing a value-based weighting partial least squares algorithm using the updated model specification parameters.

21. A computer-implemented apparatus for controlling a process based on measured physical attributes, comprising:

a non-transitory computer-readable storage medium storing a computer-defined model having data structures for storing:

(a) manifest variables based on said measured physical attributes;

(b) latent variables representing causally related attributes associated with said manifest variables;

(c) model specification parameters including a path structure parameter indicating causal path attributes to express the causal relationship between the predictor latent variables and the dependent latent variables and a value-based parameter indicating prediction priorities associated with weights of the dependent latent variables with respect to the predictor latent variables;

an initial run module that operates upon said model to provide initial estimates of weights associated with said latent variables;

a final run module that operates upon said model after said initial run module to provide final estimates of weights associated with said latent variables;

said final run module having a patient partial least squares regression module employing a machine learning algorithm that uses a forward stagewise technique with shrinkage to slow down the learning rate to thereby reduce overfitting and further employs a machine learning algorithm that uses a boosting technique;

said final run module providing path coefficients between dependent latent variables and predictor latent variables;

said final run module providing control parameter selections for controlling said process, where the control parameters are selected using the final estimates of weights associated with said latent variables.

22. A non-transitory computer-readable storage having encoded therein computer readable instructions for determining the statistical impact of a plurality of physical attributes expressed as manifest variables comprising:

an input module operable to receive raw data and to store said raw data in a raw data database;

a user interface module operable to receive inputs from a user to initialize a computer memory having data structures for storing;

(a) manifest variables based on said measured physical attributes;

(b) latent variables representing causally related attributes associated with said manifest variables, the latent variables including predictor latent variables and dependent latent variables, wherein the dependent latent variables may be expressed as a linear combination of at least one predictor latent variables;

(c) model specification parameters including a path structure parameter indicating causal path attributes to express the causal relationship between the predictor latent variables and the dependent latent variables and a value-based parameter indicating prediction priorities associated with weights of the dependent latent variables with respect to the predictor latent variables;

an initial run module operable to receive manifest variables and model specification parameters and to estimate weights of manifest variables using a value-based weighting patient least squares algorithm that employs an inside approximation weighting scheme utilizing the value-based parameter wherein estimated weights are based on the prediction priorities of the latent variables;

the initial run module further operable to update model specification parameters residing in the model specification parameter database based on results of the value-weighting patient least squares algorithm a final run module operable to receive the manifest variable data and the model specification parameters and to re-estimate weights of the manifest variables using the value-weighting patient least squares algorithm and updated model specification parameters;

the final run module further operable to calculate latent variable scores for each latent variable using the re-estimated weights and the manifest variable data, wherein the calculated latent variable scores are the weighted averages of the manifest variables, and wherein the latent variable scores are stored in said data structure storing latent variables;

the final run module further operable to calculate the path coefficients of a dependent latent variable utilizing a patient partial least squares regression algorithm that uses a forward stagewise technique with shrinkage to slow down the learning rate to thereby reduce overfitting and using a boosting machine learning algorithm; and the final run module providing control parameter selections for controlling said process, where the control parameters are selected using the final estimates of weights associated with said latent variables.

23. The non-transitory computer-readable storage medium of claim 22 wherein the initial run module is further operable to estimate weights using an inside approximation scheme based on a correlation of latent variables when the prediction priorities of the latent variables are undefined.

24. The non-transitory computer-readable storage medium of claim 22 wherein the final run module is operable to determine a correlation of a first latent variable to a second latent variable.

25. A computer-implemented apparatus for controlling a process based on measured physical attributes, comprising:

a non-transitory computer-readable storage medium having stored therein data structures storing:

(a) manifest variables based on said measured physical attributes;

(b) latent variables representing causally related attributes associated with said manifest variables, the latent variables including predictor latent variables and dependent latent variables, wherein the dependent latent variables may be expressed as a linear combination of at least one predictor latent variables;

(c) model specification parameters including a path structure parameter indicating causal path attributes to express the causal relationship between the predictor latent variables and the dependent latent variables, a value-based parameter indicating prediction priorities associated with weights of the dependent latent variables with respect to the predictor latent variables, and a measurement model parameter indicating causal relationships between the manifest variables and the latent variables;

a non-transitory computer-readable storage medium having encoded therein an initial run module receiving manifest variables from the data structure storing the manifest variables and model specification parameters from the data structure storing model parameters, the model specification parameters including the value-based parameter and the measurement model parameter;

initial run module having a means for estimating weights using a value-based partial least squares algorithm;

a non-transitory computer-readable storage medium having encoded therein a final run module receiving manifest variables from the data structure storing the manifest variables and model specification parameters from the data structure storing model parameters, the model specification parameters including the path structure parameter;

the final run module calculating latent variable scores based on the manifest variable and the estimated weights;

the final run module having a means for calculating path coefficients using a patient partial least squares algorithm;

the final run module providing control parameter selections for controlling said process, where the control parameters are selected using the final estimates of weights associated with said latent variables.

* * * * *